(12) United States Patent
Kinoshita et al.

(10) Patent No.: US 12,143,098 B2
(45) Date of Patent: Nov. 12, 2024

(54) CIRCUIT FOR SWITCHING DEVICE, SWITCHING SYSTEM, AND PROCESSING METHOD FOR SWITCHING DEVICE

(71) Applicant: Panasonic Intellectual Property Management Co., Ltd., Osaka (JP)

(72) Inventors: Yusuke Kinoshita, Kyoto (JP); Yuta Nagatomi, Kyoto (JP); Ryosuke Maeda, Osaka (JP); Satoshi Nakazawa, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 181 days.

(21) Appl. No.: 17/998,658

(22) PCT Filed: Apr. 5, 2021

(86) PCT No.: PCT/JP2021/014457
§ 371 (c)(1),
(2) Date: Nov. 12, 2022

(87) PCT Pub. No.: WO2021/246044
PCT Pub. Date: Dec. 9, 2021

(65) Prior Publication Data
US 2023/0336171 A1    Oct. 19, 2023

(30) Foreign Application Priority Data
Jun. 4, 2020 (JP) .................................. 2020-097998

(51) Int. Cl.
*H03K 17/082* (2006.01)
(52) U.S. Cl.
CPC ................................ *H03K 17/0822* (2013.01)

(58) Field of Classification Search
CPC ....... H03K 17/0822; H03K 2217/0027; H03K 17/122; H02H 3/02; H02H 3/05; H02H 3/087; H02J 1/00
(Continued)

(56) References Cited

U.S. PATENT DOCUMENTS 5,952,738 A  *  9/1999  Miller .............. H03K 17/08142
                                                        363/39
6,330,143 B1 * 12/2001  Maly .................. H03K 17/0828
                                                        361/86
(Continued)

FOREIGN PATENT DOCUMENTS

AT         516957 B1 * 10/2016 ......... H05B 33/0818
DE  102018207491 A1 * 11/2019 ....... H03K 17/08122
(Continued)

OTHER PUBLICATIONS

International Search Report of PCT application No. PCT/JP2021/014457 dated Jun. 22, 2021.

*Primary Examiner* — Dharti H Patel
(74) *Attorney, Agent, or Firm* — Rimon P.C.

(57) ABSTRACT

A power loss of a switching device is suppressed. Circuit for a switching device is used in switching device. Switching device includes first path and second path. First path includes first field effect transistor and first inductor. Second path includes second field effect transistor and second inductor. First path and second path are connected in parallel to power supply. A first maximum current that is a maximum current during conduction of first field effect transistor is smaller than a second maximum current that is a maximum current during conduction of second field effect transistor. Circuit for a switching device includes processing part. Processing part executes a specific operation according to a (Continued)

voltage difference between voltage across first inductor and voltage across second inductor.

20 Claims, 23 Drawing Sheets

(58) Field of Classification Search
USPC .......................................................... 361/101
See application file for complete search history.

(56) References Cited

U.S. PATENT DOCUMENTS

| | | | |
|---|---|---|---|
| 8,351,173 B2 * | 1/2013 | Yeh ........................ | H02H 3/202 |
| | | | 361/111 |
| 9,167,648 B2 * | 10/2015 | Yamahara ............ | H05B 45/375 |
| 2012/0243136 A1 * | 9/2012 | Mossoba ................ | H02H 9/041 |
| | | | 361/91.1 |
| 2012/0287545 A1 * | 11/2012 | Tran ........................ | H02M 1/38 |
| | | | 361/101 |
| 2023/0016211 A1 * | 1/2023 | Lee ........................ | H02M 1/083 |

FOREIGN PATENT DOCUMENTS

| | | | | |
|---|---|---|---|---|
| JP | 2006-032393 | | 2/2006 | |
| WO | WO-2004051832 A1 * | | 6/2004 | .......... H02M 3/1588 |

* cited by examiner

CIRCUIT FOR SWITCHING DEVICE, SWITCHING SYSTEM, AND PROCESSING METHOD FOR SWITCHING DEVICE

TECHNICAL FIELD

The present disclosure relates to a circuit for a switching device, a switching system, and a processing method for a switching device, and more particularly to a circuit for a switching device used in a switching device including a field effect transistor, a switching system including the circuit for the switching device, and a processing method used in a switching device.

BACKGROUND ART

PTL 1 discloses a power semiconductor device capable of preventing erroneous determination that an overcurrent is flowing although a main current is in a normal current value range.

The power semiconductor device disclosed in PTL 1 includes a gate resistor, a gate voltage determination part, a sense current determination part, and an overcurrent determination part. The sense current determination part includes a sense resistor having one terminal connected to a sense terminal of a power device and the other terminal grounded.

CITATION LIST

Patent Literature

PTL 1: Unexamined Japanese Patent Publication No. 2006-32393

SUMMARY OF THE INVENTION

In the power semiconductor device disclosed in PTL 1, a power loss occurs in the sense resistor when the power device is in an on state (during conduction).

In a circuit for a switching device used for detecting an overcurrent of a switching device or the like, it is sometimes desired to perform processing while suppressing a power loss of the switching device.

An object of the present disclosure is to provide a circuit for a switching device, a switching system, and a processing method for a switching device capable of suppressing a power loss of the switching device.

A circuit for a switching device according to one aspect of the present disclosure is used in a switching device. The switching device includes a first path and a second path. The first path includes a first field effect transistor and a first inductor. The first field effect transistor has a gate and a source. The first inductor is connected to the source of the first field effect transistor. The second path includes a second field effect transistor and a second inductor. The second field effect transistor has a gate and a source. The second inductor is connected to the source of the second field effect transistor. The first path and the second path are connected in parallel to a power supply. A first maximum current that is a maximum current during conduction of the first field effect transistor is smaller than a second maximum current that is a maximum current during conduction of the second field effect transistor. The circuit for the switching device includes a processing part that executes a specific operation in accordance with a voltage difference between a voltage across the first inductor and a voltage across the second inductor.

A switching system according to another aspect of the present disclosure includes the above-described circuit for a switching device, and the switching device.

A processing method according to another aspect of the present disclosure is used in a switching device. The switching device includes a first path and a second path. The first path includes a first field effect transistor and a first inductor. The first field effect transistor has a gate and a source. The first inductor is connected to the source of the first field effect transistor. The second path includes a second field effect transistor and a second inductor. The second field effect transistor has a gate and a source. The second inductor is connected to the source of the second field effect transistor. The first path and the second path are connected in parallel to a power supply. A first maximum current that is a maximum current during conduction of the first field effect transistor is smaller than a second maximum current that is a maximum current during conduction of the second field effect transistor. The processing method executes a specific operation according to a voltage difference between a voltage across the first inductor and a voltage across the second inductor.

The circuit for a switching device, the switching system, and the processing method for a switching device of the present disclosure can suppress the power loss of the switching device.

DESCRIPTION OF EMBODIMENT

First Exemplary Embodiment

Hereinafter, circuit 20 for a switching device according to a first exemplary embodiment and switching system 30 including the same will be described with reference to FIGS. 1 to 5.

(1) Outline

Figure 1:
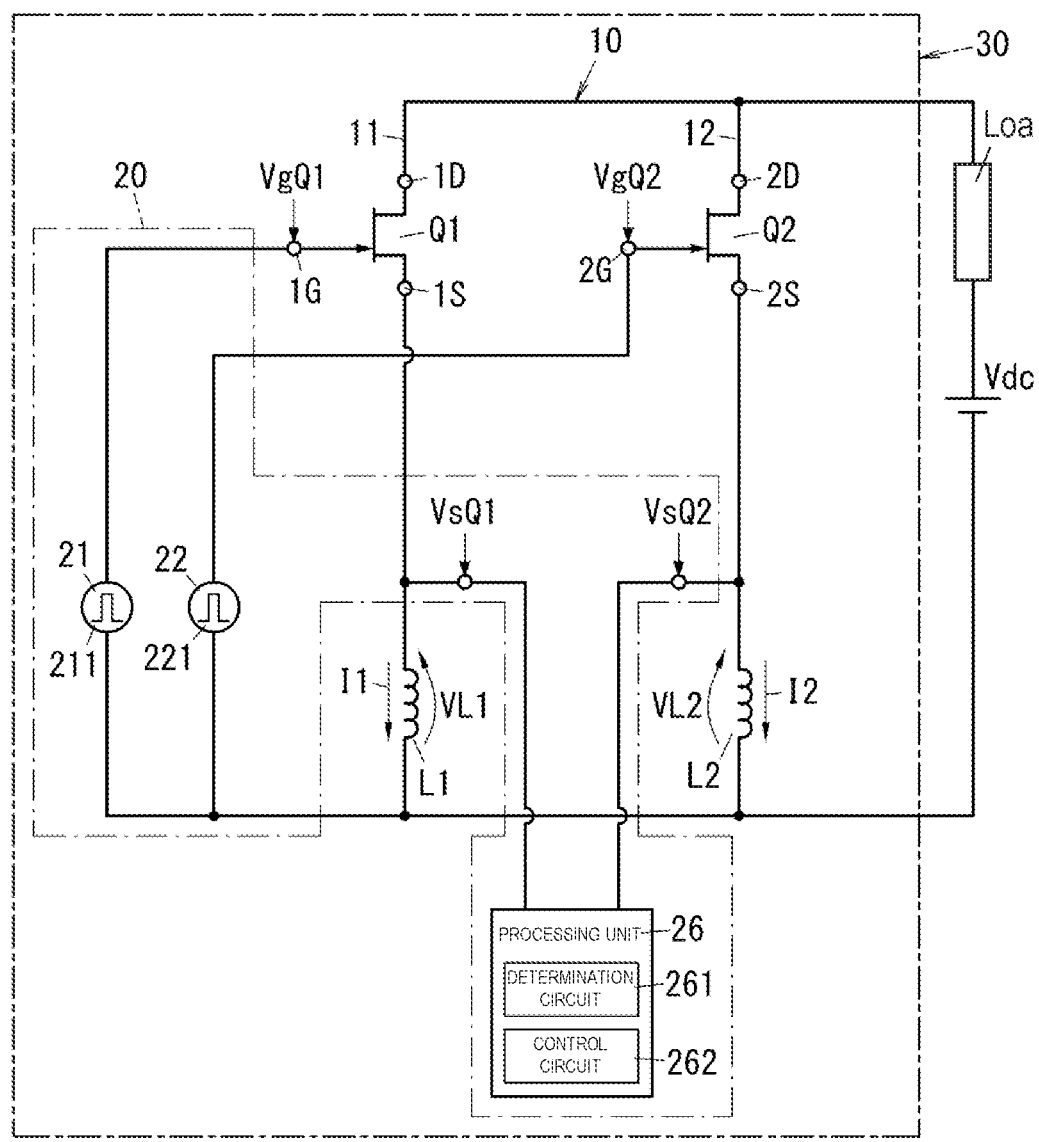
FIG. 1 is a circuit diagram of a switching system including a circuit for a switching device according to a first exemplary embodiment.

FIG. 1 illustrates a circuit diagram of switching system 30 including circuit 20 for a switching device according to the first exemplary embodiment of the present disclosure. Circuit 20 for a switching device is used for switching device 10. In switching system 30, for example, power supply Vdc is connected to switching device 10. Power supply Vdc is a DC power supply. For example, load Loa is connected between power supply Vdc and switching device 10. In this case, a load circuit including a series circuit of load Loa and power supply Vdc is connected to switching device 10. Note that load Loa may be, for example, an element such as a resistive element or a light emitting diode (LED), a circuit such as a matching circuit, or a device such as a computer or a display. In switching device 10, first path 11 including first field effect transistor (first FET) Q1, and second path 12 including second field effect transistor (second FET) Q2 are connected in parallel. First path 11 further includes first inductor L1 connected in series to first field effect transistor Q1. Second path 12 further includes second inductor L2 connected in series to second field effect transistor Q2.

Circuit 20 for a switching device executes a specific operation when an overcurrent flows through switching device 10 due to occurrence of anomaly such as a short circuit of a load circuit connected to switching device 10, for example. The specific operation includes, for example, an operation of detecting an overcurrent. In the operation of detecting an overcurrent, for example, it is determined whether or not an overcurrent is flowing through switching device 10. The overcurrent is a current having a magnitude exceeding a rated current of a main current flowing through switching device 10, and is, for example, a short circuit current. The specific operation may include an operation of controlling switching device 10.

(2) Each Component of Switching System (2.1) Switching Device

Switching device 10 includes first path 11 and second path 12. First path 11 includes first field effect transistor Q1 and first inductor L1. First field effect transistor Q1 includes gate 1G and source 1S. Further, first field effect transistor Q1 has drain 1D. First inductor L1 is connected to source 1S of first field effect transistor Q1. Second path 12 includes second field effect transistor Q2 and second inductor L2. Second field effect transistor Q2 has gate 2G and source 2S. Further, second field effect transistor Q2 has drain 2D. Second inductor L2 is connected to source 2S of second field effect transistor Q2. First path 11 and second path 12 are connected in parallel to power supply Vdc. In switching device 10, drain 1D of first field effect transistor Q1 and drain 2D of second field effect transistor Q2 are connected. Further, in switching device 10, first inductor L1 connected to source 1S of first field effect transistor Q1 and second inductor L2 connected to source 2S of second field effect transistor Q2 are connected.

Figure 2:
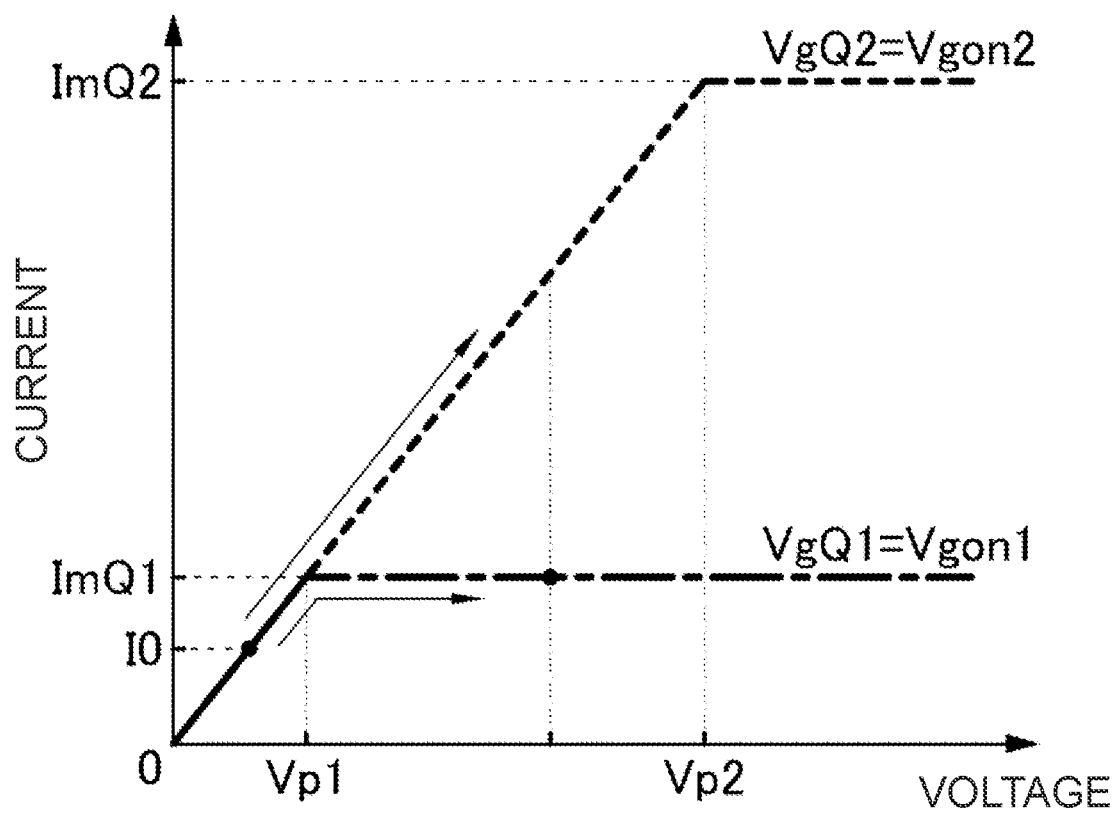
FIG. 2 is an operation explanatory diagram of a switching device to which the above-described circuit for a switching device is applied.

An operation of switching device 10 to which circuit 20 for a switching device is applied will be described with reference to FIG. 2. FIG. 2 is an operation explanatory diagram of switching device 10 to which circuit 20 for a switching device is applied.

First maximum current ImQ1 (see voltage-current characteristics in FIG. 2), which is a maximum current when first field effect transistor Q1 is in conduction, is smaller than second maximum current ImQ2 (see voltage-current characteristics in FIG. 2), which is a maximum current when second field effect transistor Q2 is in conduction. The voltage-current characteristics in FIG. 2 are drain voltage-drain current characteristics of first field effect transistor Q1 and second field effect transistor Q2. FIG. 2 is a schematic voltage-current characteristic diagram in a case where the on-resistance of first field effect transistor Q1 and the on-resistance of second field effect transistor Q2 have the same value, and the inductance of first inductor L1 and the inductance of second inductor L2 have the same value. In FIG. 2, I0 indicates a magnitude of a current flowing through first field effect transistor Q1 and second field effect transistor Q2 in normal time. In the example illustrated in FIG. 2, gate voltage Vgon1 at the time of conduction of first field effect transistor Q1 is smaller than gate voltage Vgon2 at the time of conduction of second field effect transistor Q2. Vp1 in FIG. 2 is a pinch-off voltage of first field effect transistor Q1. Further, Vp2 in FIG. 2 is a pinch-off voltage of second field effect transistor Q2. First maximum current ImQ1 is a saturation current of first field effect transistor Q1 in a state where gate voltage Vgon1 larger than a threshold voltage is applied to gate 1G of first field effect transistor Q1 as first gate voltage VgQ1. Gate voltage Vgon1 is a gate voltage at the time of conduction of first field effect transistor Q1. Second maximum current ImQ2 is a saturation current of second field effect transistor Q2 in a state where gate voltage Vgon2 larger than a threshold voltage is applied to gate 2G of second field effect transistor Q2 as second gate voltage VgQ2. Gate voltage Vgon2 is a gate voltage at the time of conduction of second field effect transistor Q2. First maximum current ImQ1 is larger than a rated current of a main current (drain current) of first field effect transistor Q1. Second maximum current ImQ2 is larger than a rated current of a main current (drain current) of second field effect transistor Q2. In the example of FIG. 2, I0 is 10 A, first maximum current ImQ1 is 20 A, and second maximum current ImQ2 is 80 A, but the present invention is not limited to these numerical values.

When a voltage between drain 1D and source 1S of first field effect transistor Q1 is Vds1, a voltage between both ends of first inductor L1 is VL1, a voltage between drain 2D and source 2S of second field effect transistor Q2 is Vds2, and a voltage between both ends of second inductor L2 is VL2, Vds1+VL1=Vds2+VL2. Further, when Vds1≤Vp1, VL1=VL2, and thus Vds1=Vds2.

Each of first field effect transistor Q1 and second field effect transistor Q2 is, for example, a junction field effect transistor (JFET). The JFET includes at least a JFET chip, but may further include a package accommodating the JFET chip. The JFET constituting each of first field effect transistor Q1 and second field effect transistor Q2 is, for example, a GaN-based gate injection transistor (GIT). Each of first field effect transistor Q1 and second field effect transistor Q2 is not limited to the JFET, and may be, for example, a metal-oxide-semiconductor field effect transistor (MOSFET). The MOSFET includes at least a MOSFET chip, but may further include a package accommodating the MOSFET chip. In switching device 10, first field effect transistor Q1 and second field effect transistor Q2 may be included in a one-chip semiconductor chip.

The JFET chip includes, for example, a substrate, a buffer layer, a first nitride semiconductor layer, a second nitride semiconductor layer, a source electrode, a gate electrode, a drain electrode, and a p-type layer. The buffer layer is formed on the substrate. The first nitride semiconductor layer is formed on the buffer layer. The second nitride semiconductor layer is formed on the first nitride semiconductor layer. The source electrode, the gate electrode, and the drain electrode are formed on the second nitride semiconductor layer. The p-type layer is interposed between the gate electrode and the second nitride semiconductor layer. In the JFET, the second nitride semiconductor layer and the p-type layer constitute a diode. The gate in the JFET includes the gate electrode and the p-type layer. The source in the JFET includes the source electrode. The drain in the JFET includes the drain electrode. The substrate is, for example, a silicon substrate. The buffer layer is, for example, an undoped GaN layer. The first nitride semiconductor layer is, for example, an undoped GaN layer. The second nitride semiconductor layer is, for example, an undoped AlGaN layer. The p-type layer is, for example, a p-type AlGaN layer. Each of the buffer layer, the first nitride semiconductor layer, and the second nitride semiconductor layer may contain impurities such as Mg, H, Si, C, and O inevitably mixed during growth by metal organic vapor phase epitaxy (MOVPE) or the like.

(2.2) Circuit for Switching Device

Circuit 20 for a switching device includes processing part 26. Processing part 26 executes a specific operation according to a voltage difference ΔV (=VL2−VL1) between voltage VL1 across first inductor L1 and voltage VL2 across second inductor L2. Circuit 20 for a switching device further includes first drive circuit 21 that drives first field effect transistor Q1 and second drive circuit 22 that drives second field effect transistor Q2.

Processing part 26 operates as a trigger when first current I1 flowing through first path 11 and second current I2 flowing through second path 12 change from a current value less than first maximum current (ImQ1) to a current value greater than or equal to first maximum current (ImQ1). The specific operation includes an operation of determining that an overcurrent is flowing through switching device 10 when there is a predetermined change in voltage difference ΔV.

Figure 3A:
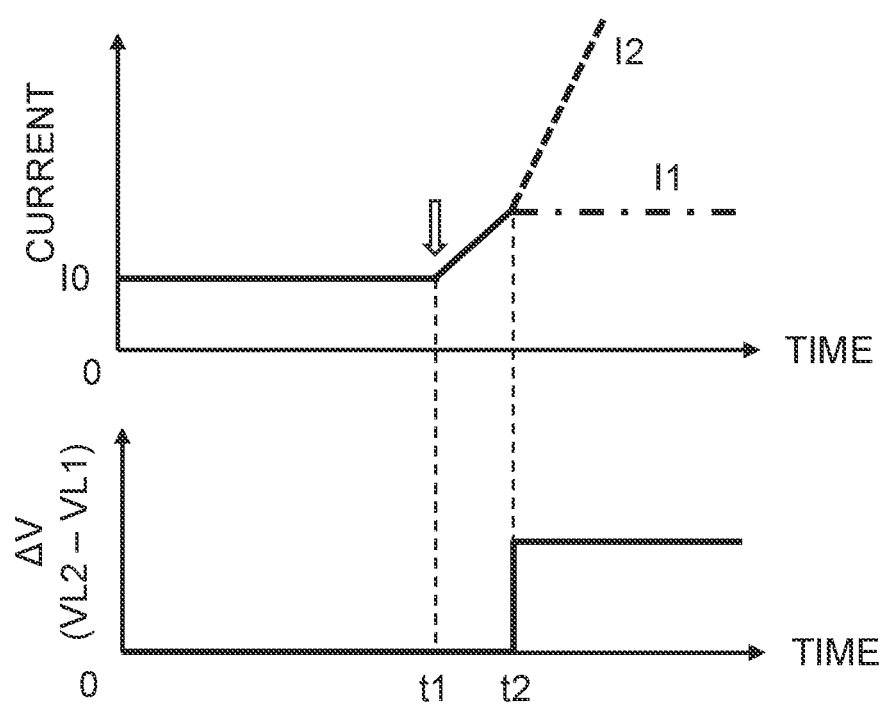
FIG. 3A is an explanatory diagram of a normal operation of the switching system including the above-described circuit for a switching device.
Figure 3B:
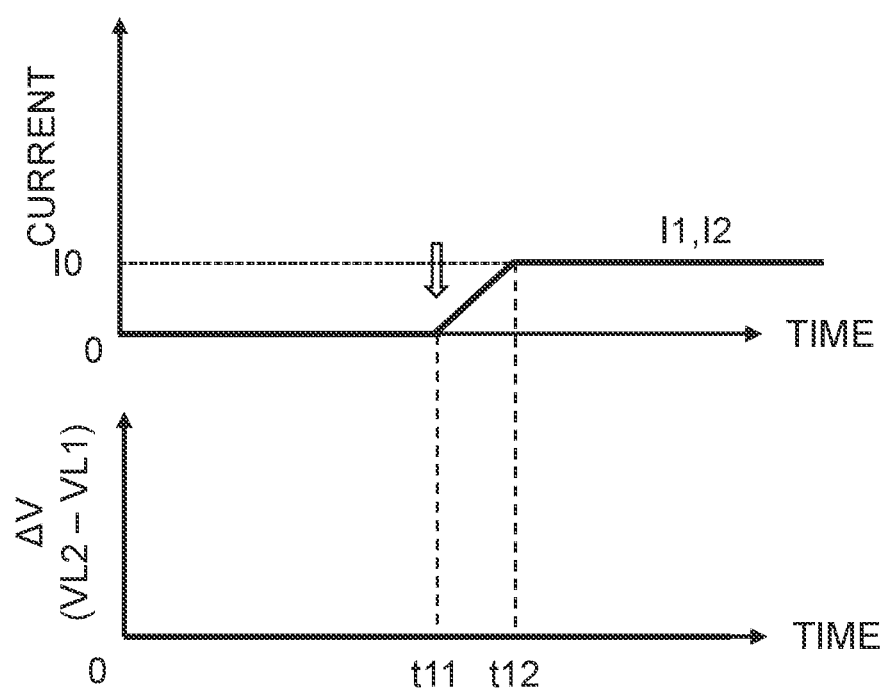
FIG. 3B is an operation explanatory diagram at the time of startup of the switching system including the above-described circuit for a switching device.

The operation of switching system 30 including circuit 20 for a switching device will be described with reference to FIGS. 3A and 3B. That is, FIGS. 3A and 3B are diagrams for explaining the operation of switching system 30 including circuit 20 for a switching device. The graph illustrated in FIG. 3A is a graph illustrating magnitudes of first current I1, second current I2, and voltage difference ΔV during the operation of switching system 30 before and after the occurrence of anomaly. Further, the graph illustrated in FIG. 3B is a graph illustrating magnitudes of first current I1, second current I2, and voltage difference ΔV at the time of startup in switching system 30.

In switching system 30, in normal time, the magnitudes of first current I1 and second current I2 are both I0 as illustrated in FIGS. 3A and 3B. Note that the "normal time" refers to a time until time point t1 at the time of operation in FIG. 3, and refers to a time after time point t12 at the time of startup. In switching system 30, it is assumed that anomaly such as a short circuit failure occurs at certain time point t1 during operation. At that time, first current I1 and second current I2 start to increase from I0. In switching system 30, first current I1 reaches first maximum current ImQ1 at time point t2 after time point t1. Thereafter, first current I1 is saturated at first maximum current ImQ1. On the other hand, second current I2 increases at current change rate (di/dt) larger than that between time points t1 and t2 after time point t2. Voltage VL1 across first inductor L1 is generated in response to a change in first current I1. Further, voltage VL2 across second inductor L2 is generated in response to a change in second current I2. Thus, voltage difference ΔV (=VL2−VL1) changes at time point t2. When voltage VL1 is generated, potential VsQ1 of source 1S of first field effect transistor Q1 changes. Further, when voltage VL2 is generated, potential VsQ2 of source 2S of second field effect transistor Q2 changes.

At the time of startup of switching system 30, switching system 30 is activated at time point t11, and a time point at which the currents of first current I1 and second current I2 become I0 is defined as t12. At that time, first current I1 and second current I2 change from 0 A at time point t11 to current I0 at time point t12 as indicated by a solid line in FIG. 3B. Also at this time, voltage VL1 is generated across first inductor L1, and voltage VL2 is generated across second inductor L2. However, voltage VL1 and voltage VL2 have the same value, and voltage difference ΔV does not change as indicated by the solid line. In switching system 30, when switching device 10 is turned on, voltage difference ΔV does not change as at the time of startup.

Figure 4:
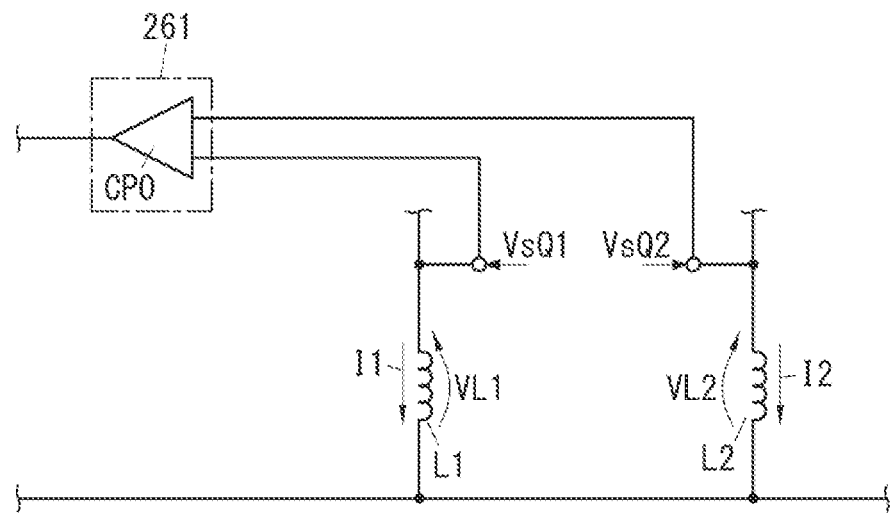
FIG. 4 is a circuit diagram illustrating an example of a determination circuit in the above-described circuit for a switching device.

Processing part 26 further includes, for example, a determination circuit 261 and a control circuit 262. FIG. 4 is a circuit diagram illustrating an example of determination circuit 261 in circuit 20 for a switching device. Determination circuit 261 includes, for example, comparator CP0 as illustrated in FIG. 4. Comparator CP0 compares potential VsQ1 (voltage VL1 across first inductor L1) of source is of first field effect transistor Q1 with potential VsQ2 (voltage VL2 across second inductor L2) of source 2S of second field effect transistor Q2. In comparator CP0, when voltage VL2 changes from the same value as voltage VL1 to a value larger than voltage VL1, an output signal changes from a first voltage level (low level) to a second voltage level (high level). Therefore, determination circuit 261 can detect the presence or absence of the occurrence of an overcurrent, and can suppress erroneous detection.

For example, control circuit 262 controls first field effect transistor Q1 and second field effect transistor Q2 based on a determination result of determination circuit 261. Here, control circuit 262 controls first field effect transistor Q1 by controlling first drive circuit 21. For example, control circuit 262 sets first gate voltage VgQ1 applied from first gate power supply 211 of first drive circuit 21 to first field effect transistor Q1 to 0 V. Further, control circuit 262 controls second field effect transistor Q2 by controlling second drive circuit 22. For example, control circuit 262 sets second gate voltage VgQ2 applied from second gate power supply 221 of second drive circuit 22 to second field effect transistor Q2 to 0 V.

First drive circuit 21 includes first gate power supply 211 connected to gate 1G of first field effect transistor Q1, and drives first field effect transistor Q1. First gate power supply 211 includes a first DC power supply and a first driver integrated circuit (IC). The first driver IC is, for example, a complementary metal-oxide semiconductor (CMOS) inverter, and includes an anti-series circuit of a p-channel MOSFET and an n-channel MOSFET. The anti-series circuit is connected between an output end on a high potential side and an output end on a low potential side of the first DC power supply. In this anti-series circuit, the drains of the p-channel MOSFET and the n-channel MOSFET are connected to each other. Further, a source of the p-channel MOSFET is connected to the output end on the high potential side of the first DC power supply. Furthermore, a source of the n-channel MOSFET is connected to the output end on the low potential side of the first DC power supply.

Second drive circuit 22 includes second gate power supply 221 connected to gate 2G of second field effect transistor Q2, and drives second field effect transistor Q2. Second gate power supply 221 includes, for example, a second DC power supply and a second driver IC. The second driver IC is, for example, a CMOS inverter, and includes an anti-series circuit of a p-channel MOSFET and an n-channel MOSFET. The anti-series circuit is connected between an output end on the high potential side and an output end on the low potential side of the second DC power supply. In this anti-series circuit, the drains of the p-channel MOSFET and the n-channel MOSFET are connected to each other. Further, a source of the p-channel MOSFET is connected to the output end on the high potential side of the second DC power supply. Furthermore, a source of the n-channel MOSFET is connected to the output end on the low potential side of the second DC power supply.

In circuit 20 for a switching device, a negative electrode of first gate power supply 211 is connected to source 1S of first field effect transistor Q1. Here, in circuit 20 for a switching device according to the first exemplary embodiment, the negative electrode of first gate power supply 211 is connected to source 1S of first field effect transistor Q1 via first inductor L1. Further, in circuit 20 for a switching device, the negative electrode of second gate power supply 221 is connected to source 2S of second field effect transistor Q2. Here, in circuit 20 for a switching device according to the first exemplary embodiment, the negative electrode of second gate power supply 221 is connected to source 2S of second field effect transistor Q2 via second inductor L2.

Figure 5:
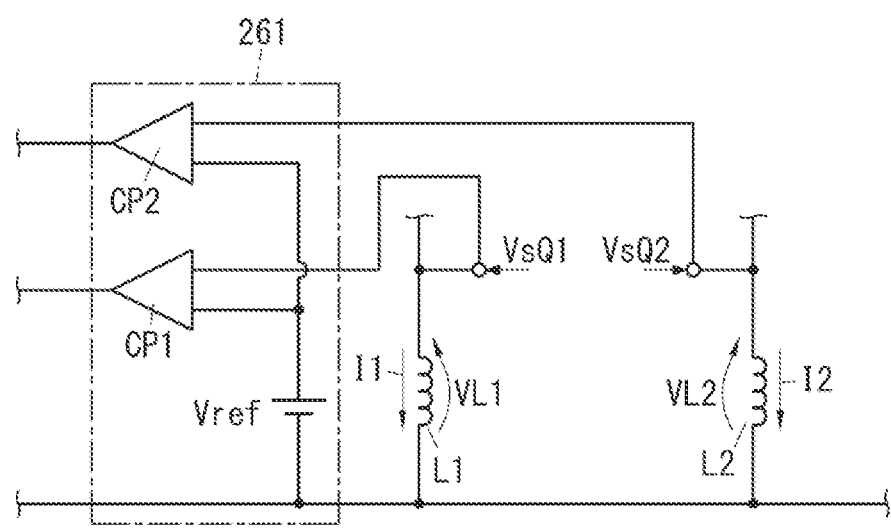
FIG. 5 is a circuit diagram illustrating another example of the determination circuit in the above-described circuit for a switching device.

Determination circuit 261 is not limited to the example of FIG. 4, and may include first comparator CP1 and second comparator CP2 as in another example illustrated in FIG. 5. That is, FIG. 5 is a circuit diagram illustrating another example of determination circuit 261 in circuit 20 for a switching device. In this case, in determination circuit 261, first comparator CP1 compares voltage VL1 across first inductor L1 (potential VsQ1 of source 1S of first field effect transistor Q1) with a reference voltage of reference voltage source Vref. In first comparator CP1, when voltage VL1 changes from a value less than the reference voltage to a value larger than the reference voltage, an output signal changes from a first voltage level (low level) to a second voltage level (high level). In determination circuit 261, second comparator CP2 compares voltage VL2 across second inductor L2 (potential VsQ2 of source 2S of second field effect transistor Q2) with a reference voltage of reference voltage source Vref. In second comparator CP2, when voltage VL2 changes from a value less than the reference voltage to a value larger than the reference voltage, an output signal changes from a first voltage level (low level) to a second voltage level (high level). Therefore, in determination circuit 261, by appropriately setting the reference voltage, it is possible to set the output signal of first comparator CP1 to the low level and the output signal of second comparator CP2 to the high level only when an overcurrent occurs in switching device 10.

Control circuit 262 controls first drive circuit 21 and second drive circuit 22 based on a determination result of determination circuit 261. An execution subject of control circuit 262 (control part) includes a computer system. The computer system includes one or a plurality of computers. The computer system mainly includes a processor and a memory as hardware. A processor executes a program recorded in a memory of a computer system, thereby implementing a function as an execution subject of control circuit 262 (control part) in the present disclosure. The program may be recorded into the memory of the computer system in advance but may be provided through a telecommunication line or may be provided in a state of being recorded in a non-transitory recording medium such as a memory card, an optical disk, or a hard disk drive (magnetic disk) capable of being read in the computer system. The processor of the computer system includes one or a plurality of electronic circuits including a semiconductor integrated circuit (IC) or a large-scale integration (LSI). The plurality of electronic circuits may be integrated into one chip or may be provided in a distributed manner on a plurality of chips. The plurality of chips may be aggregated in one device or may be provided in a distributed manner in a plurality of devices.

(3) Advantages

In circuit 20 for a switching device according to the first exemplary embodiment, processing part 26 executes a specific operation according to voltage difference $\Delta V$ between voltage VL1 across first inductor L1 and voltage VL2 across second inductor L2, so that it is possible to suppress the power loss in switching device 10. Here, in circuit 20 for a switching device according to the first exemplary embodiment, for example, in a case where a specific operation is overcurrent detection, erroneous detection can be suppressed. In switching device 10, an overcurrent can be detected without connecting a shunt resistor for overcurrent detection to source 1S of first field effect transistor Q1 and without connecting the shunt resistor for overcurrent detection to source 2S of second field effect transistor Q2, and the power loss can be suppressed.

Further, since switching system 30 according to the first exemplary embodiment includes circuit 20 for a switching device and switching device 10, it is possible to suppress the power loss in switching device 10.

(4) Others

The first exemplary embodiment discloses the following processing method.

The processing method is used for switching device 10. Switching device 10 includes first path 11 and second path 12. First path 11 includes first field effect transistor Q1 and first inductor L1. First field effect transistor Q1 includes gate 1G and source 1S. First inductor L1 is connected to source 1S of first field effect transistor Q1. Second path 12 includes second field effect transistor Q2 and second inductor L2. Second field effect transistor Q2 has gate 2G and source 2S. Second inductor L2 is connected to source 2S of second field effect transistor Q2. First path 11 and second path 12 are connected in parallel to power supply Vdc. First maximum current ImQ1 of first field effect transistor Q1 is smaller than second maximum current ImQ2 of second field effect transistor Q2. The processing method executes a specific operation according to voltage difference ΔV between voltage VL1 across first inductor L1 and voltage VL2 across second inductor L2. According to this processing method, it is possible to suppress the power loss in switching device 10.

(5) Modification Example

An operation of switching system 30 including circuit 20 for a switching device according to a modification example of the first exemplary embodiment will be described with reference to FIGS. 6 and 7.

The circuit configurations of circuit 20 for a switching device and switching system 30 according to the modification example are similar to those of circuit 20 for a switching device and switching system 30 according to the first exemplary embodiment, and thus, illustration and description thereof are omitted.

Switching system 30 according to the modification example is different from switching system 30 according to the first exemplary embodiment in that an inductance value of first inductor L1 connected to first field effect transistor Q1 is smaller than an inductance value of second inductor L2 connected to second field effect transistor Q2.

Figure 6:
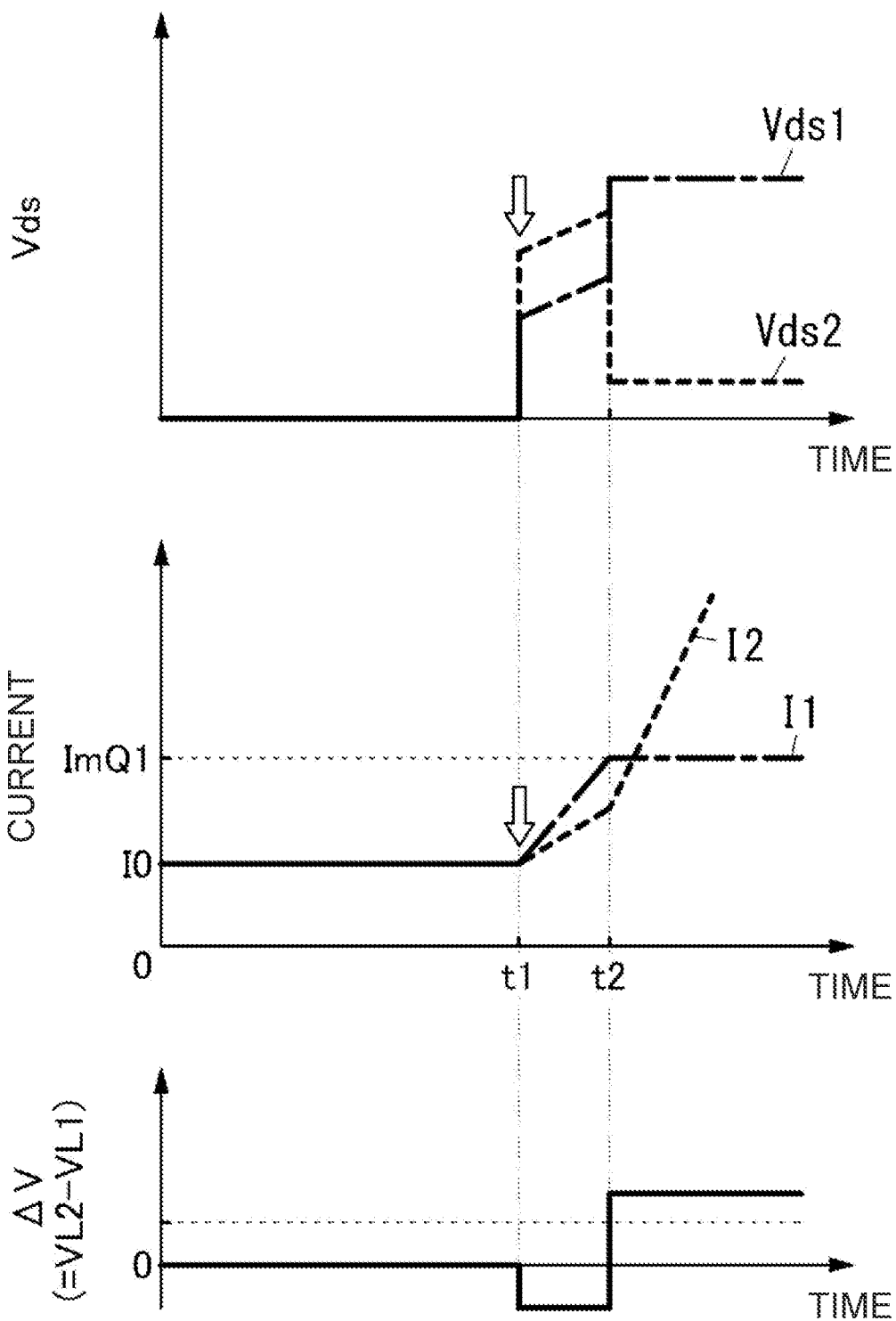
FIG. 6 is an operation explanatory diagram of a switching system including a circuit for a switching device according to a modification example of the first exemplary embodiment.

FIG. 6 is a diagram for explaining an operation of switching system 30 including circuit 20 for a switching device according to the present modification example. In switching system 30 according to the modification example, as illustrated in FIG. 6, it is assumed that anomaly occurs at certain time point t1 during normal operation. At that time, voltage Vds1 between drain 1D and source 1S of first field effect transistor Q1 increases, and voltage Vds2 between drain 2D and source 2S of second field effect transistor Q2 increases. Further, each of first current I1 and second current I2 changes so as to increase from current I0 in normal time.

Note that the "normal time" is a time until time point t1 in FIG. 6. At this time, in switching system 30 according to the modification example, a current change rate of first current I1 and a current change rate of second current I2 are different from each other. More specifically, the current change rate of current I1 flowing through the first inductor having a relatively small inductance value between first inductor L1 and second inductor L2 is larger than the current change rate of current I2 flowing through second inductor L2. Therefore, current I1 flowing through first field effect transistor Q1 reaches first maximum current ImQ1 of first field effect transistor Q1 earlier than current I2 flowing through second field effect transistor Q2. In switching system 30 according to the modification example, the current change rate of first current I1 from time point t1 to time point t2 is larger than the current change rate of second current I2, and ΔV becomes a negative value in a period from time point t1 to time point t2.

Figure 7:
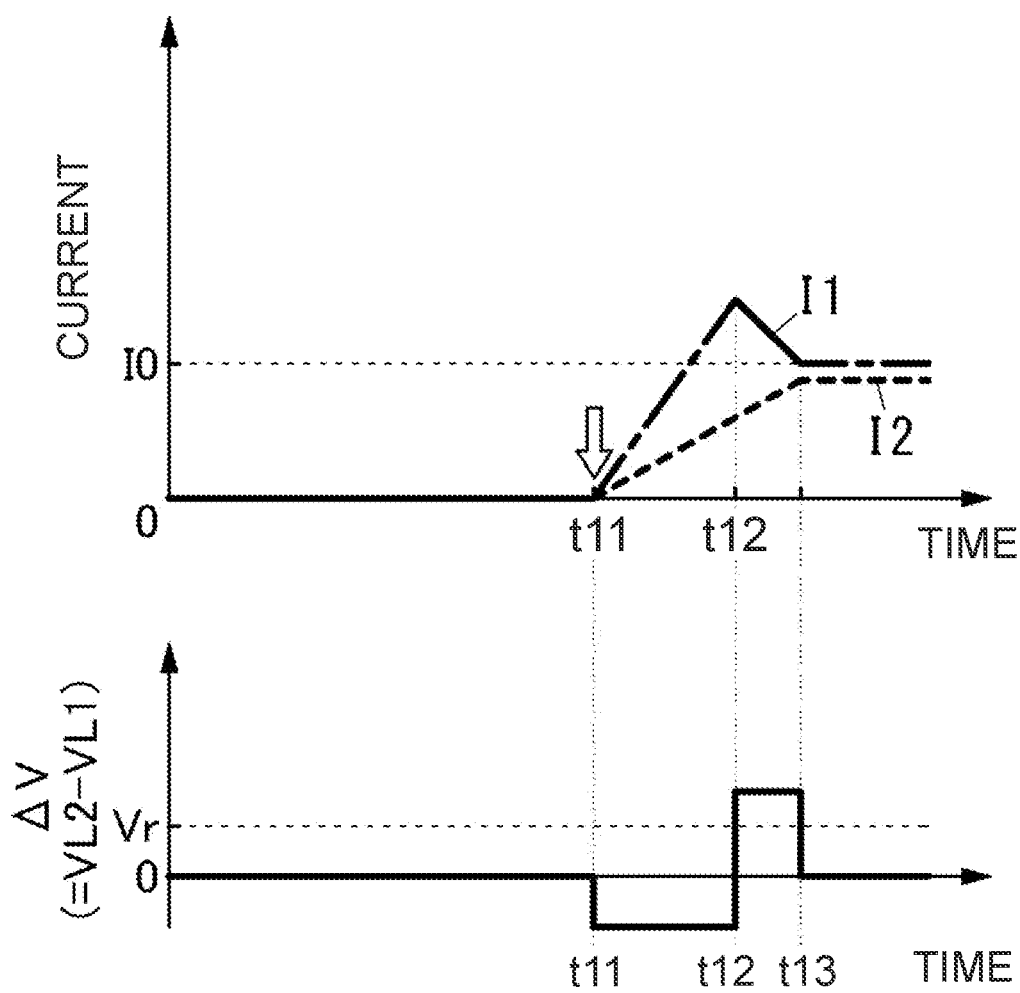
FIG. 7 is an operation explanatory diagram of the switching system including the circuit for a switching device according to the modification example of the first exemplary embodiment.

FIG. 7 is a diagram for explaining an operation of switching system 30 including circuit 20 for a switching device at the time of startup according to the present modification example. In switching system 30 according to the modification example, at the time of startup, first current I1 changes as indicated by an alternate long and short dashed line in FIG. 7, while second current I2 changes as indicated by a broken line in FIG. 7. At the time of startup, the current change rate of first current I1 from time point t11 to time point t12 is larger than the current change rate of second current I2, and ΔV becomes a negative value in a period from time point t11 to time point t12. Further, in the period from time point t11 to time point t12, first current I1 may temporarily become larger than current I0 in normal time (a stable state). Therefore, in a period from time point t12 to time point t13 when first current I1 and second current I2 have the same value, ΔV can be a positive value. Therefore, processing part 26 of circuit 20 for a switching device according to the modification example may be configured to determine that an overcurrent is generated when ΔV exceeds threshold voltage Vr for a predetermined time period or more. In this case, for example, processing part 26 may include a comparator that compares ΔV with threshold voltage Vr, and a circuit that determines that an overcurrent has occurred when a voltage level of an output voltage of the comparator continues for a certain period of time or more. Here, the certain period of time is determined in advance to be longer than the period from time point t12 to time point t13.

Second Exemplary Embodiment

Figure 8:
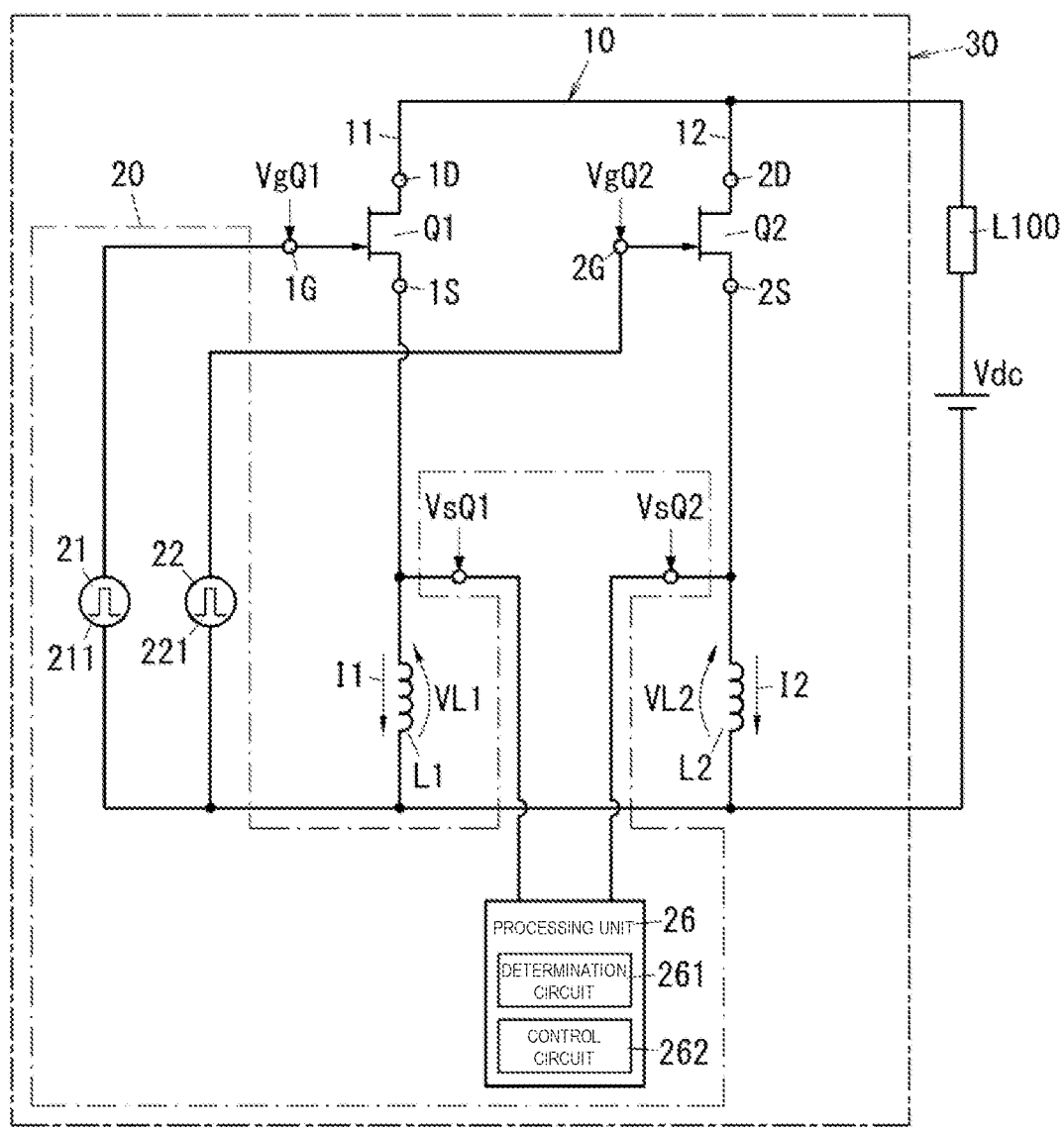
FIG. 8 is a circuit diagram of a switching system including a circuit for a switching device according to a second exemplary embodiment.
Figure 9:
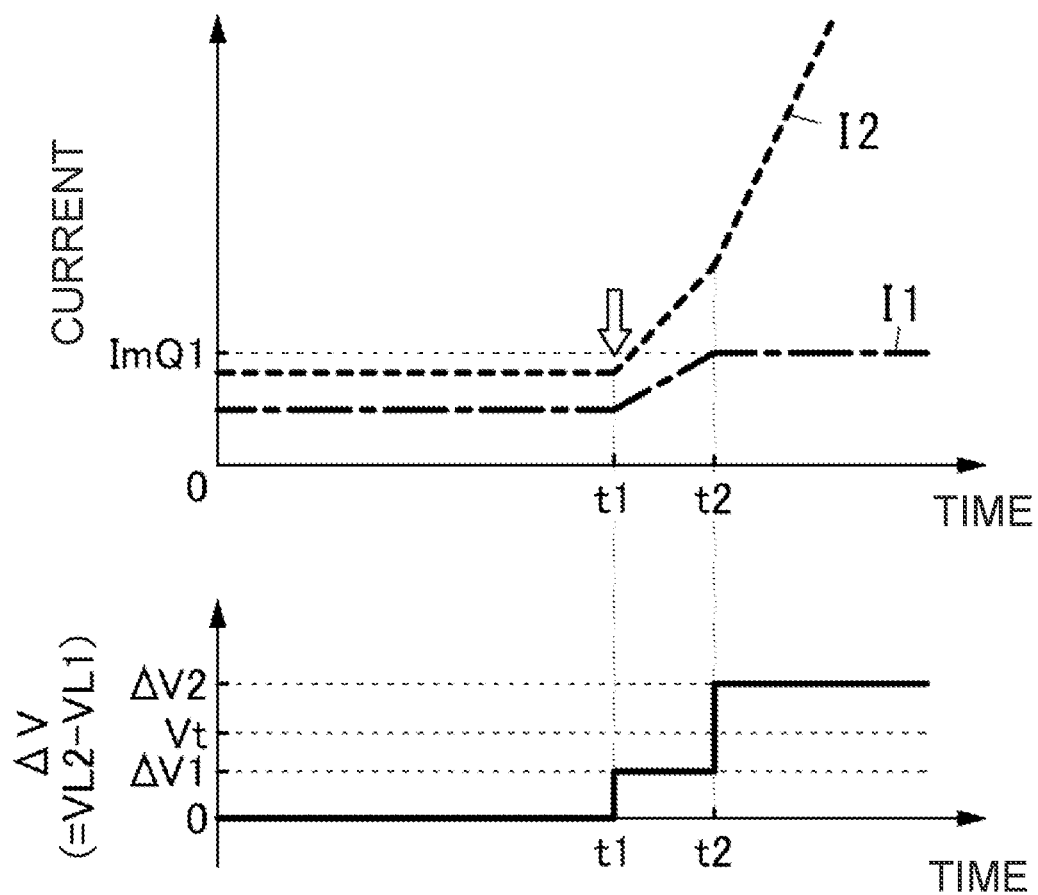
FIG. 9 is an operation explanatory diagram of the switching system including the above-described circuit for a switching device.

Hereinafter, circuit 20 for a switching device according to a second exemplary embodiment and switching system 30 including the same will be described with reference to FIGS. 8 and 9. FIG. 8 is a circuit diagram of switching system 30 including circuit 20 for a switching device according to the second exemplary embodiment. Further, FIG. 9 is a diagram for explaining an operation of switching system 30 including circuit 20 for a switching device according to the second exemplary embodiment. The circuit configurations of circuit 20 for a switching device and switching system 30 according to the second exemplary embodiment are the same as those of circuit 20 for a switching device and switching system 30 according to the first exemplary embodiment, and thus the description thereof will be omitted. In FIG. 8, parasitic inductance L100 of a load circuit connected between both ends of switching device 10 is illustrated.

In switching device 10 to which circuit 20 for a switching device according to the second exemplary embodiment is applied, an on-resistance of first field effect transistor Q1 and an on-resistance of second field effect transistor Q2 are different from each other.

In switching device 10, the on-resistance of first field effect transistor Q1 and the on-resistance of second field effect transistor Q2 are made different from each other by making a size of first field effect transistor Q1 and a size of second field effect transistor Q2 different from each other. In switching system 30, for example, first gate voltage VgQ1 and second gate voltage VgQ2 have the same value, and the on-resistance of first field effect transistor Q1 is twice the on-resistance of second field effect transistor Q2.

In switching system 30 according to the second exemplary embodiment, as illustrated in FIG. 9, in a normal state before anomaly occurs at time point t1, each of first current I1 and second current I2 is substantially constant, but first current I1 is smaller than second current I2. After time point t1, when first current I1 reaches first maximum current ImQ1 at time point t2, ΔV is generated also in a period from time point t1 to time point t2, and ΔV is generated also after time point t2. Here, ΔV generated in the period from time point t1 to time point t2 is ΔV1. (see FIG. 9) for convenience of description, and ΔV1=L2·dI2/dt−L1·dI1/dt where the inductance of first inductor L1 is L1 and the inductance of second inductor L2 is L2. Further, at and after time point t2, for convenience of description, when ΔV is ΔV2 (see FIG. 9), ΔV2=L2·dI2/dt. Further, ΔV generated at the time of turn-on is a value determined by the same formula as ΔV1.

Therefore, when a comparator that compares ΔV with threshold Vt (see FIG. 9) is adopted in determination circuit 261 of processing part 26 for overcurrent detection, threshold Vt may be determined in advance so as to satisfy the condition of ΔV1<Vt<ΔV2.

Circuit 20 for a switching device according to the second exemplary embodiment can suppress a power loss, similarly to circuit 20 for a switching device according to the first exemplary embodiment. In switching device 10 according to the second exemplary embodiment, there is an advantage that the on-resistance of first field effect transistor Q1 and the on-resistance of second field effect transistor Q2 may be different from each other. In switching system 30 according to the second exemplary embodiment, first maximum current ImQ1 of first field effect transistor Q1 and second maximum current ImQ2 of second field effect transistor Q2 can be made different from each other without making first gate voltage VgQ1 and second gate voltage VgQ2 different from each other.

Third Exemplary Embodiment

Figure 10:
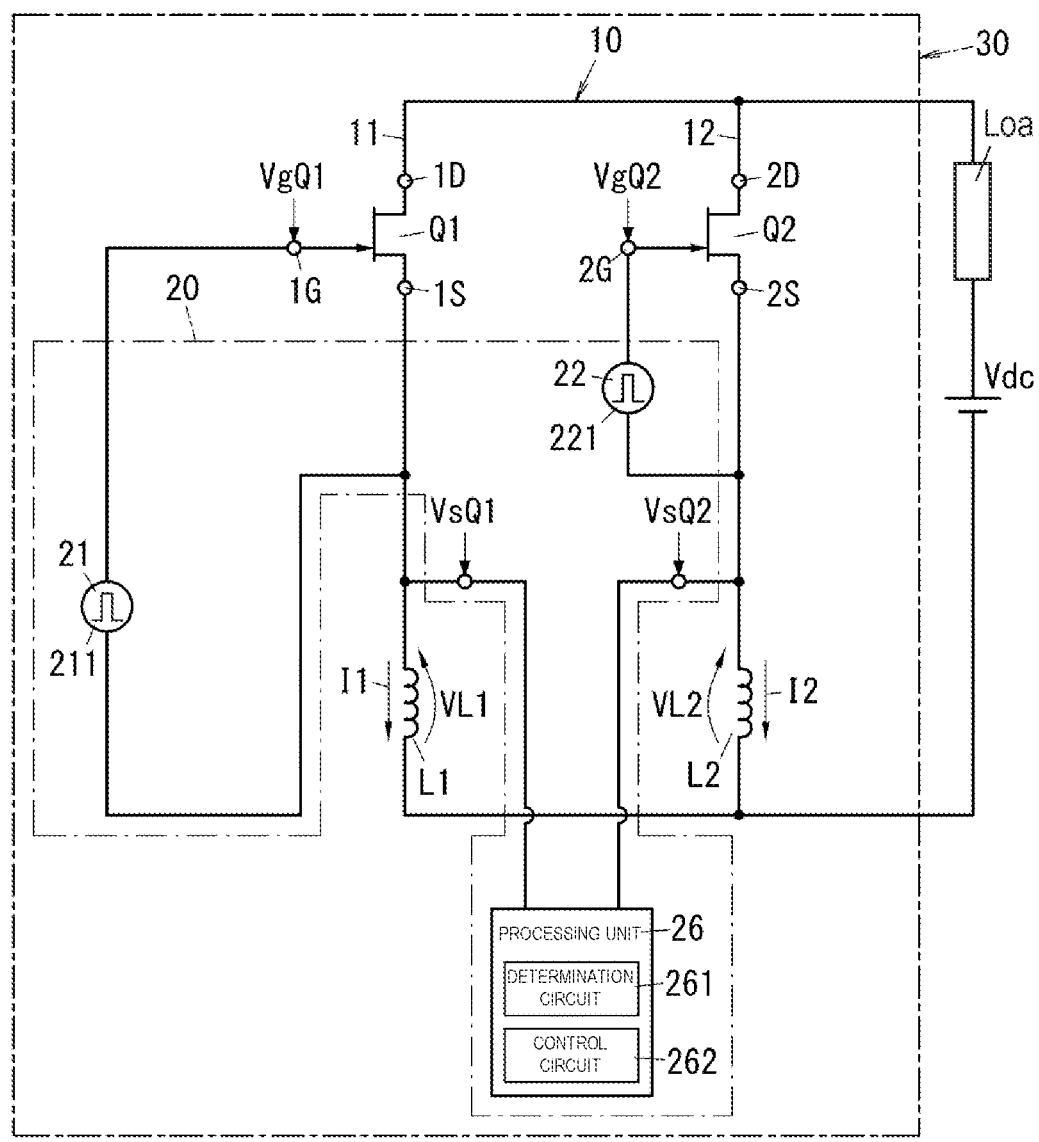
FIG. 10 is a circuit diagram of a switching system including a circuit for a switching device according to a third exemplary embodiment.

Hereinafter, circuit 20 for a switching device according to a third exemplary embodiment and switching system 30 including the same will be described with reference to FIG. 10. FIG. 10 is a circuit diagram of switching system 30 including circuit 20 for a switching device according to the third exemplary embodiment. With regard to circuit 20 for a switching device and switching system 30 according to the third exemplary embodiment, the same reference signs are given to the same components as those of circuit for a switching device and switching system 30 according to the first exemplary embodiment, and the description thereof will be appropriately omitted.

As illustrated in FIG. 1, in circuit 20 for a switching device according to the first exemplary embodiment, the negative electrode of first gate power supply 211 of first drive circuit 21 and the negative electrode of second gate power supply 221 of second drive circuit 22 are connected. On the other hand, circuit 20 for a switching device according to the third exemplary embodiment is different from circuit 20 for a switching device according to the first exemplary embodiment in that first drive circuit 21 and second drive circuit 22 are independent from each other.

In circuit 20 for a switching device according to the third exemplary embodiment, a negative electrode of first gate power supply 211 is connected to source 1S of first field effect transistor Q1 without first inductor L1 interposed therebetween, and a negative electrode of second gate power supply 221 is connected to source 2S of second field effect transistor Q2 without second inductor L2 interposed therebetween. As a result, in circuit 20 for a switching device according to the third exemplary embodiment, first gate voltage VgQ1 of first field effect transistor Q1 is provided with reference to potential VsQ1 of source 1S, and second gate voltage VgQ2 of second field effect transistor Q2 is provided with reference to potential VsQ2 of source 2S. As a result, in circuit 20 for a switching device, first gate voltage VgQ1 is less likely to be affected by voltage VL1 of first inductor L1, and second gate voltage VgQ2 is less likely to be affected by voltage VL2 of second inductor L2. Therefore, switching system 30 including circuit 20 for a switching device can be expected to operate more stably than switching system 30 according to the first exemplary embodiment.

Fourth Exemplary Embodiment

Figure 11:
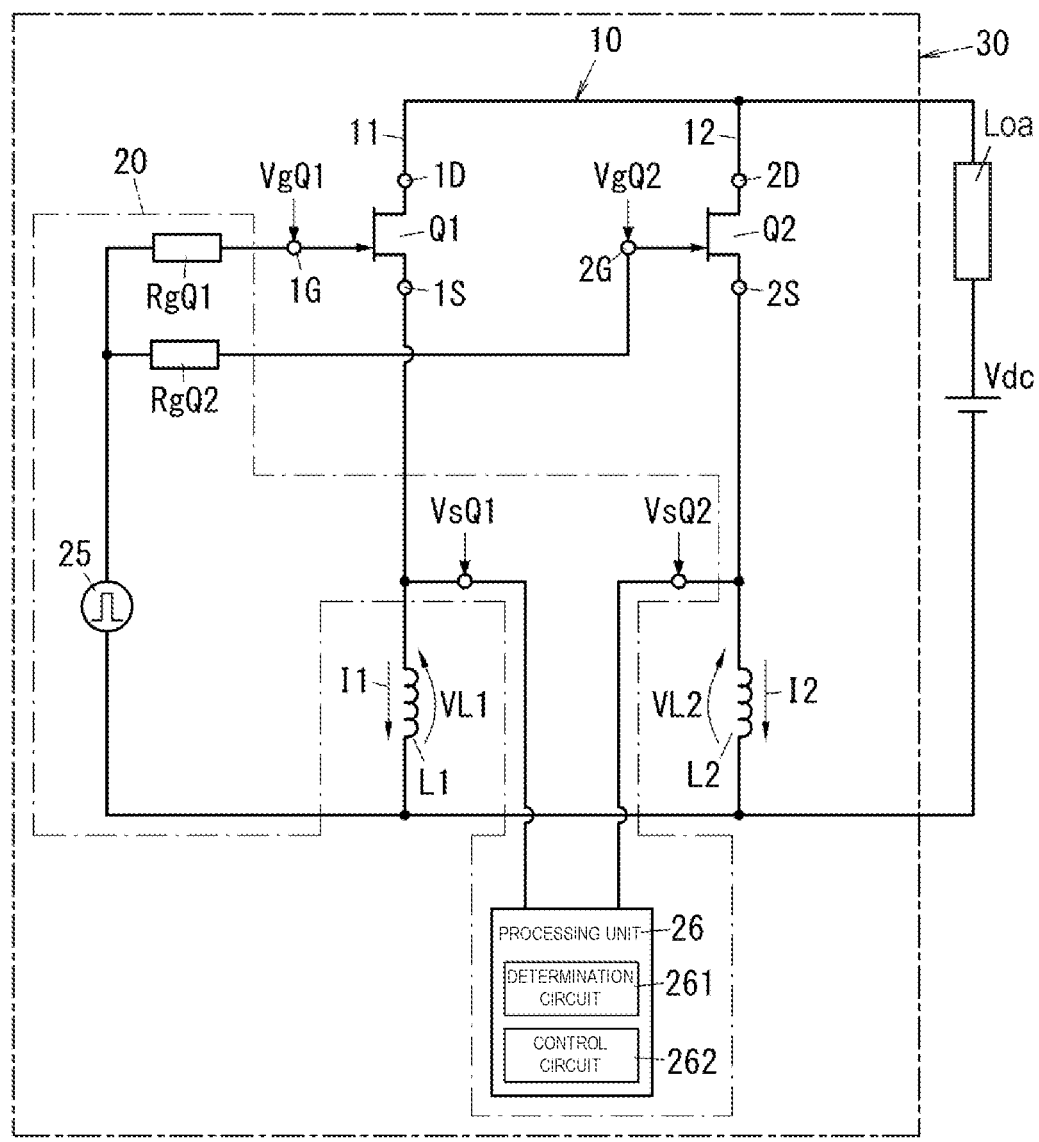
FIG. 11 is a circuit diagram of a switching system including a circuit for a switching device according to a fourth exemplary embodiment.
Figure 12:
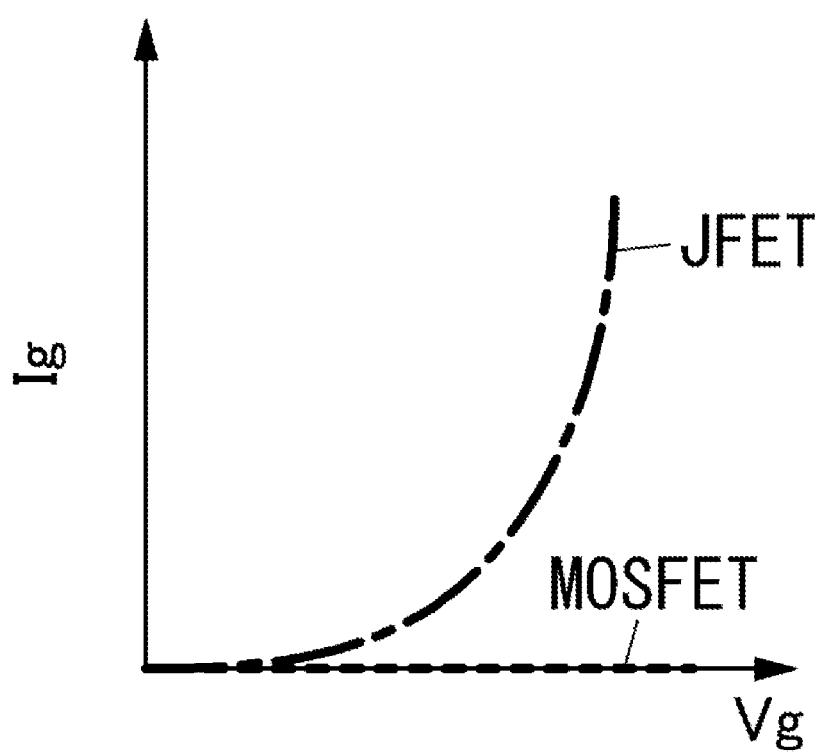
FIG. 12 is a gate voltage-gate current characteristic diagram of a JFET and a MOSFET.

Hereinafter, circuit 20 for a switching device according to a fourth exemplary embodiment and switching system 30 including the same will be described with reference to FIGS. 11 and 12. FIG. 11 is a circuit diagram of switching system 30 including circuit 20 for a switching device according to the fourth exemplary embodiment. FIG. 12 is a gate voltage-gate current characteristic diagram of the JFET and the MOSFET. With regard to circuit 20 for a switching device and switching system 30 according to the fourth exemplary embodiment, the same reference signs are given to the same components as those of circuit 20 for a switching device and switching system 30 according to the first exemplary embodiment, and the description thereof will be appropriately omitted.

In switching system 30 including circuit 20 for a switching device according to the fourth exemplary embodiment, each of first field effect transistor Q1 and second field effect transistor Q2 in switching device 10 is a JFET (for example, the GaN-based GIT described in the first exemplary embodiment). Here, the JFET is, for example, the GaN-based GIT described in the first exemplary embodiment, and has a gate voltage Vg-gate current Ig characteristic as indicated by an alternate long and short dashed line in FIG. 12. In FIG. 12, for comparison, a gate voltage Vg-gate current Ig characteristic of the MOSFET is indicated by a broken line.

Circuit 20 for a switching device according to the fourth exemplary embodiment further includes gate power supply 25, first gate resistor RgQ1, and second gate resistor RgQ2. First gate resistor RgQ1 is connected between gate power supply 25 and gate 1G of first field effect transistor Q1. Second gate resistor RgQ2 is connected between gate power supply 25 and gate 2G of second field effect transistor Q2. In circuit 20 for a switching device, a resistance value of first gate resistor RgQ1 is larger than a resistance value of second gate resistor RgQ2. As a result, in circuit 20 for a switching device, a first gate current flowing through gate 1G of first field effect transistor Q1 is smaller than a second gate current flowing through gate 2G of second field effect transistor Q2. Therefore, in circuit 20 for a switching device, first gate voltage VgQ1 when first field effect transistor Q1 is turned on is smaller than second gate voltage VgQ2 when second field effect transistor Q2 is turned on.

Circuit 20 for a switching device according to the fourth exemplary embodiment can achieve cost reduction as compared with the case of including first gate power supply 211 and second gate power supply 221 as in circuit 20 for a switching device according to the first exemplary embodiment or the like.

Fifth Exemplary Embodiment

Figure 13:
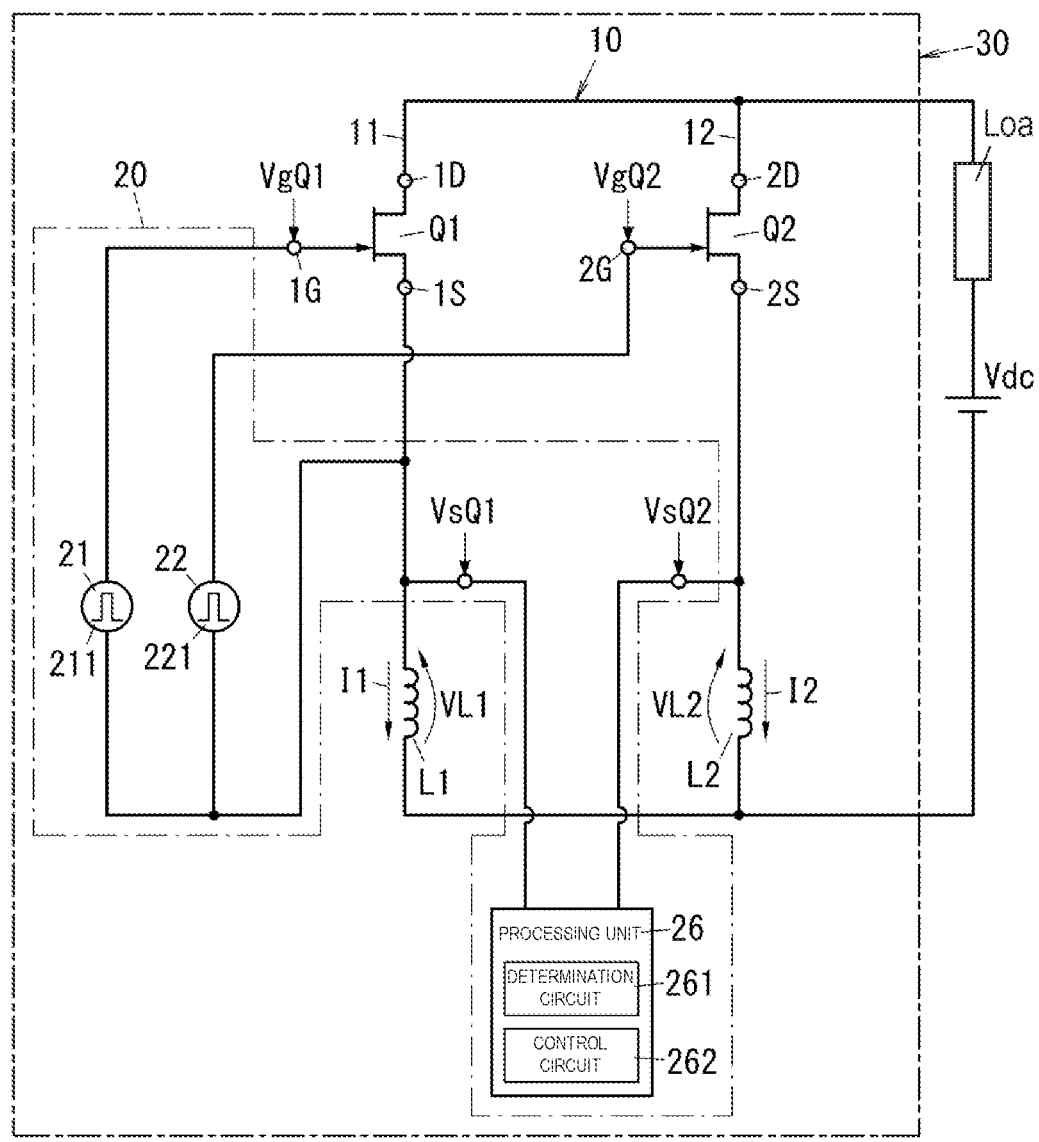
FIG. 13 is a circuit diagram of a switching system including a circuit for a switching device according to a fifth exemplary embodiment.

Hereinafter, circuit 20 for a switching device according to a fifth exemplary embodiment and switching system 30 including the same will be described with reference to FIG. 13. FIG. 13 is a circuit diagram of switching system 30 including circuit 20 for a switching device according to the fifth exemplary embodiment. With regard to circuit 20 for a switching device and switching system 30 according to the fifth exemplary embodiment, the same reference signs are given to the same components as those of circuit 20 for a switching device and switching system 30 according to the first exemplary embodiment, and the description thereof will be appropriately omitted.

In circuit 20 for a switching device according to the fifth exemplary embodiment, a reference potential of first drive circuit 21 and a reference potential of second drive circuit 22 are set to a potential common to potential VsQ1 of source 1S of first field effect transistor Q1. More specifically, in circuit 20 for a switching device, a negative electrode of first gate power supply 211 in first drive circuit 21 and a negative electrode of second gate power supply 221 in second drive circuit 22 are connected to source 1S of first field effect transistor Q1 without passing through either first inductor L1 or second inductor L2. Maximum current ImQ1 of first field effect transistor Q1 is smaller than maximum current ImQ2 of second field effect transistor Q2.

In circuit 20 for a switching device according to the fifth exemplary embodiment, first gate voltage VgQ1 of first field effect transistor Q1 is smaller than second gate voltage VgQ2 of second field effect transistor Q2.

In circuit 20 for a switching device, when current change rate dI1/dt of first current I1 becomes smaller than current change rate dI2/dt of second current I2, a difference between potential VsQ1 of source 1S of first field effect transistor Q1 and potential VsQ2 of source 2S of second field effect transistor Q2 increases (potential VsQ1 of source 1S<potential VsQ2 of source 2S). As a result, a voltage between gate 2G and source 2S of second field effect transistor Q2 decreases, second gate voltage VgQ2 applied to second field effect transistor Q2 decreases, and second current I2 flowing through second field effect transistor Q2 decreases, so that an overcurrent can be suppressed.

In circuit 20 for a switching device according to the fifth exemplary embodiment, the negative electrode of first gate power supply 211 in first drive circuit 21 and the negative electrode of second gate power supply 221 in second drive circuit 22 are connected to source 1S of first field effect transistor Q1 without passing through either first inductor L1 or second inductor L2. Processing part 26 includes determination circuit 261 that determines an electromotive voltage generated in the inductor, and control circuit 262 that controls first field effect transistor Q1 and second field effect transistor Q2. As a result, in circuit 20 for a switching device according to the fifth exemplary embodiment, it is possible to suppress an overcurrent from flowing through second field effect transistor Q2.

Sixth Exemplary Embodiment

Figure 14:
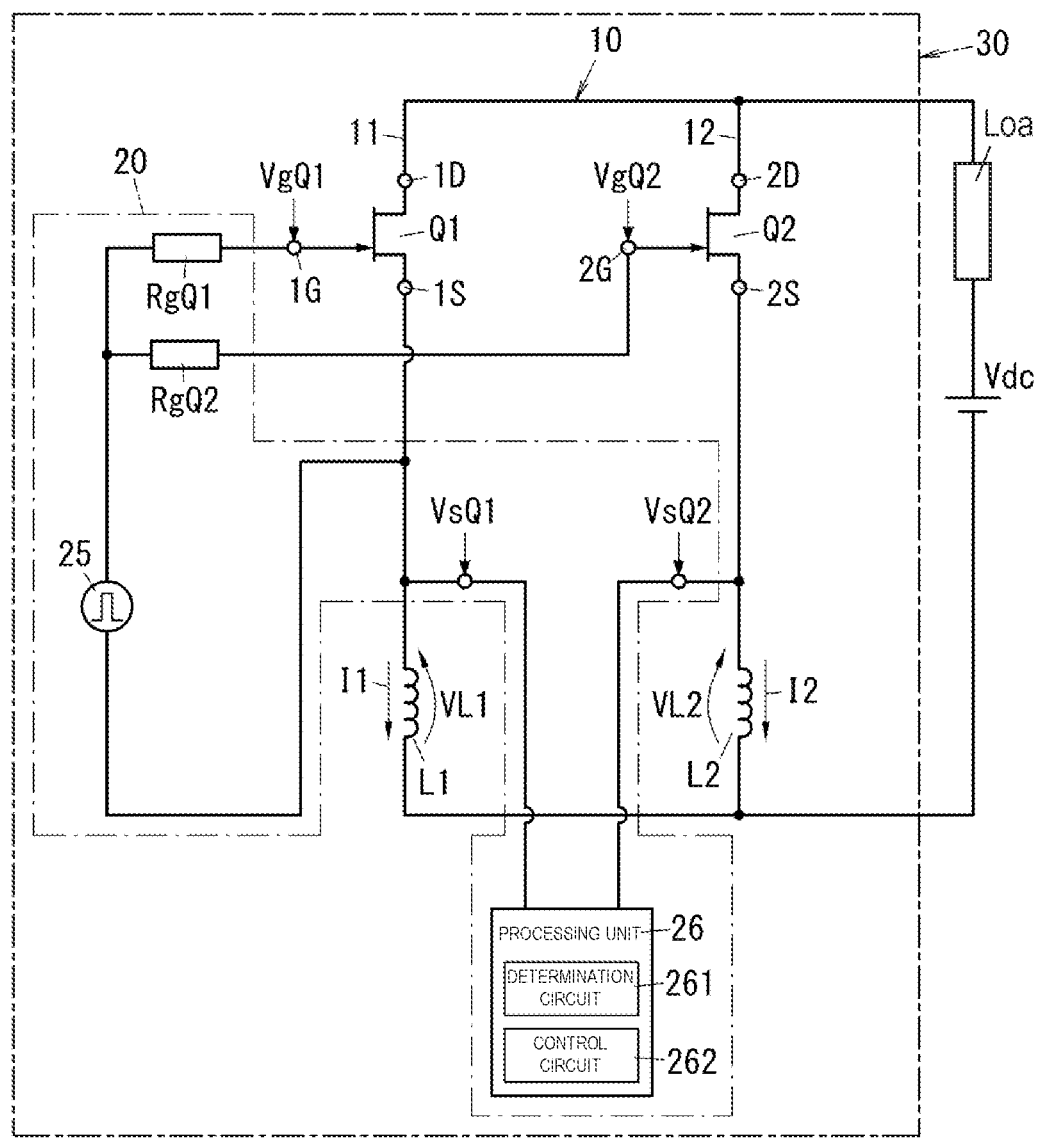
FIG. 14 is a circuit diagram of a switching system including a circuit for a switching device according to a sixth exemplary embodiment.

Hereinafter, circuit 20 for a switching device according to a sixth exemplary embodiment and switching system 30 including the same will be described with reference to FIG. 14. FIG. 14 is a circuit diagram of switching system 30 including circuit 20 for a switching device according to the sixth exemplary embodiment. With respect to circuit 20 for a switching device and switching system 30 according to the sixth exemplary embodiment, the same reference signs are given to the same components as those of circuit 20 for a switching device and switching system 30 according to the fourth exemplary embodiment described with reference to FIG. 11, and the description thereof will be appropriately omitted.

In circuit 20 for a switching device according to the sixth exemplary embodiment, a reference potential of gate power supply 25 is set to a potential common to potential VsQ1 of source 1S of first field effect transistor Q1. More specifically, in circuit 20 for a switching device, a negative electrode of gate power supply 25 is connected to source 1S of first field effect transistor Q1 without passing through either first inductor L1 or second inductor L2. Maximum current ImQ1 of first field effect transistor Q1 is smaller than maximum current ImQ2 of second field effect transistor Q2.

In circuit 20 for a switching device according to the sixth exemplary embodiment, first gate voltage VgQ1 of first field effect transistor Q1 is smaller than second gate voltage VgQ2 of second field effect transistor Q2.

In circuit 20 for a switching device, when current change rate dI1/dt of first current I1 becomes smaller than current change rate dI2/dt of second current I2, a difference between potential VsQ1 of source 1S of first field effect transistor Q1 and potential VsQ2 of source 2S of second field effect transistor Q2 increases (potential VsQ1 of source 1S<potential VsQ2 of source 2S). As a result, a voltage between gate 2G and source 2S of second field effect transistor Q2 decreases, second gate voltage VgQ2 applied to second field effect transistor Q2 decreases, and second current I2 flowing through second field effect transistor Q2 decreases, so that an overcurrent can be suppressed.

In circuit 20 for a switching device according to the sixth exemplary embodiment, a negative electrode of gate power supply 25 is connected to source 1S of first field effect transistor Q1 with neither first inductor L1 nor second inductor L2 interposed therebetween. Processing part 26 includes determination circuit 261 that determines an electromotive voltage generated in the inductor, and control circuit 262 that controls first field effect transistor Q1 and second field effect transistor Q2. As a result, in circuit 20 for a switching device according to the sixth exemplary embodiment, it is possible to suppress an overcurrent from flowing through second field effect transistor Q2.

Seventh Exemplary Embodiment

Figure 15:
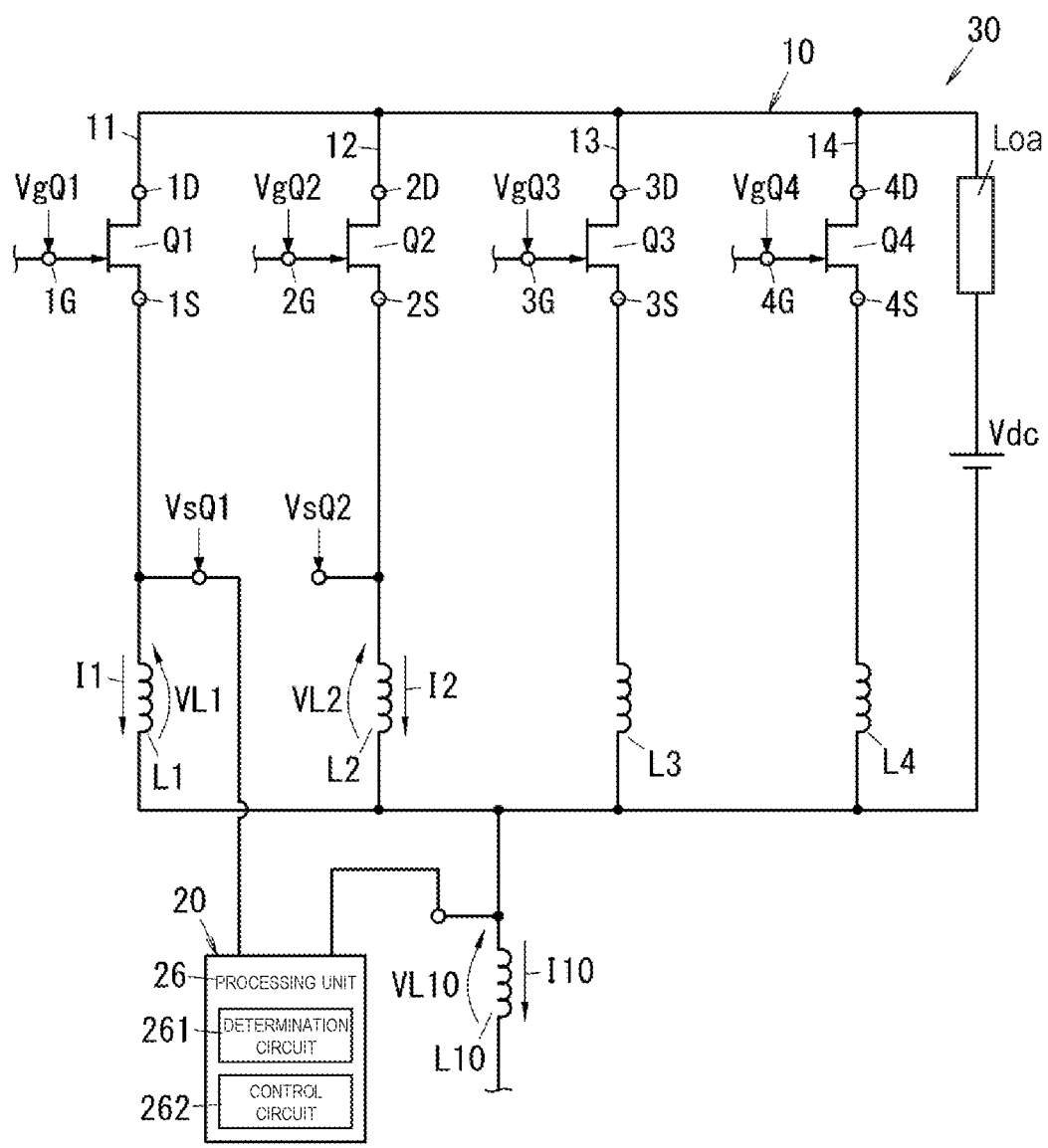
FIG. 15 is a circuit diagram of a switching system including a circuit for a switching device according to a seventh exemplary embodiment.
Figure 16:
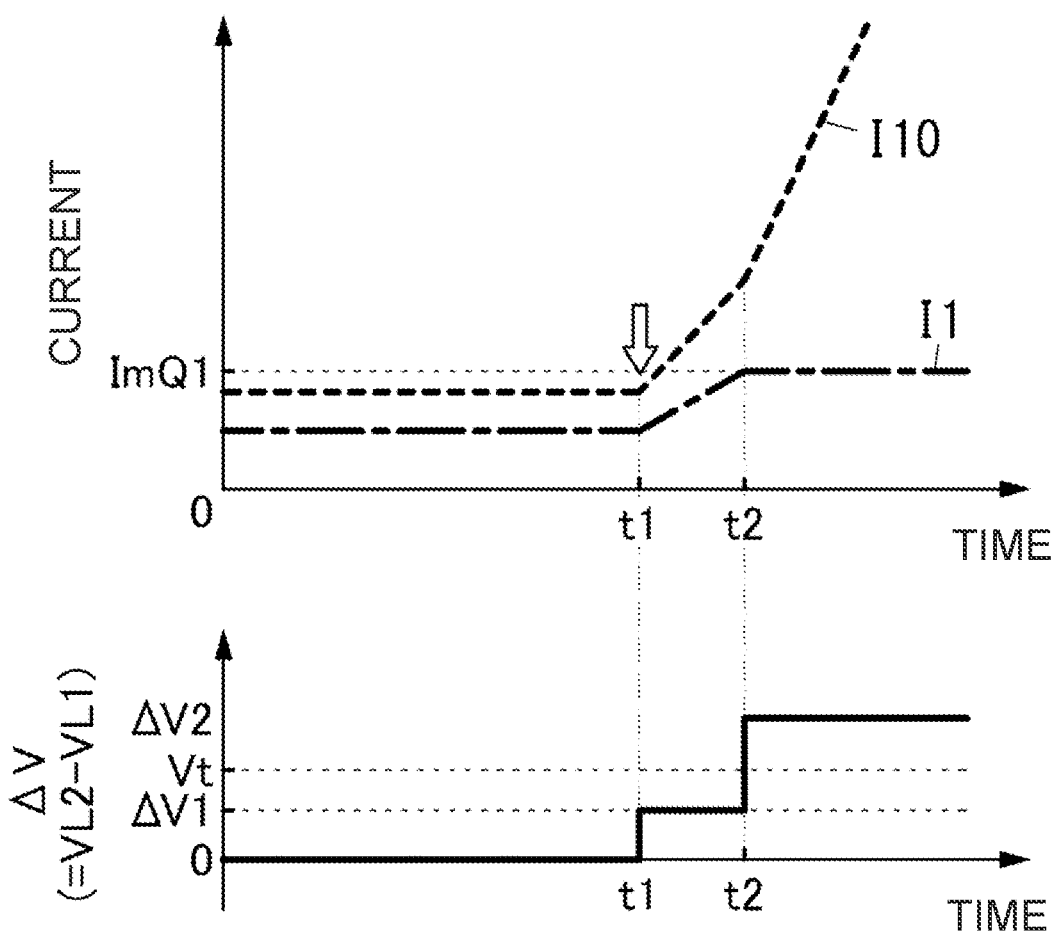
FIG. 16 is an operation explanatory diagram of the switching system including the above-described circuit for a switching device.

Hereinafter, switching system 30 including circuit 20 for a switching device according to a seventh exemplary embodiment will be described with reference to FIGS. 15 and 16. FIG. 15 is a circuit diagram of switching system 30 including circuit 20 for a switching device according to the seventh exemplary embodiment. FIG. 16 is a diagram for explaining an operation of switching system 30 including circuit 20 for a switching device according to the seventh exemplary embodiment.

In circuit 20 for a switching device and switching system 30 according to the seventh exemplary embodiment, the same reference signs are given to the same components as those of circuit 20 for a switching device and switching system 30 according to the first exemplary embodiment, and the description thereof will be appropriately omitted.

Circuit 20 for a switching device according to the seventh exemplary embodiment is different from circuit 20 for a switching device according to the first exemplary embodiment in that switching device 10 to which circuit 20 for a switching device is applied further includes third path 13 and fourth path 14 in addition to first path 11 and second path 12. Third path 13 and fourth path 14 are connected in parallel with first path 11 and second path 12.

Third path 13 includes third field effect transistor Q3 and third inductor L3 connected in series with third field effect transistor Q3. Third field effect transistor Q3 has gate 3G, source 3S, and drain 3D. Source 3S of third field effect transistor Q3 is connected to third inductor L3. For example, third gate voltage VgQ3 is applied from third drive circuit (not illustrated) to gate 3G of third field effect transistor Q3. Drain 3D of third field effect transistor Q3 is connected to drain 1D of first field effect transistor Q1 and drain 2D of second field effect transistor Q2.

Fourth path 14 includes fourth field effect transistor Q4 and fourth inductor L4 connected in series with fourth field effect transistor Q4. Fourth field effect transistor Q4 has gate 4G, source 4S, and drain 4D. Source 4S of fourth field effect transistor Q4 is connected to fourth inductor L4. For example, fourth gate voltage VgQ4 is applied from fourth drive circuit (not illustrated) to gate 4G of fourth field effect transistor Q4. Drain 4D of fourth field effect transistor Q4 is connected to drain 1D of first field effect transistor Q1, drain 2D of second field effect transistor Q2, and drain 3D of third field effect transistor Q3.

Circuit 20 for a switching device according to the seventh exemplary embodiment further includes common inductor L10. In common inductor L10, first inductor L1 and second inductor L2 are connected in common. Here, in addition to first inductor L1 and second inductor L2, third inductor L3 and fourth inductor L4 are also commonly connected to common inductor L10. In short, three or more inductors (here, first inductor L1 to fourth inductor L4) are commonly connected to common inductor L10.

A specific operation of processing part 26 is an operation of performing overcurrent detection by comparing voltage difference ΔV between voltage VL10 across common inductor L10 and voltage VL1 across first inductor L1 with threshold Vt. Hereinafter, a current flowing through common inductor L10 will be described as total current I10.

In switching system 30 according to the seventh exemplary embodiment, as illustrated in FIG. 16, in a normal state before anomaly occurs at time point t1, each of first current I1 and total current I10 is substantially constant; but first current I1 is smaller than total current I10. When first current I1 reaches first maximum current ImQ1 at time point t2 after time point t1, ΔV is generated also in a period from time point t1 to time point t2, and ΔV is generated also after time point t2. Here, ΔV generated in a period from time point t1 to time point t2 is ΔV1 (see FIG. 16) for convenience of description, and when the inductance of first inductor L1 is L1 and the inductance of common inductor L10 is L10, ΔV1=L10·dI10/dt−L1·dI1/dt. Further, from time point t2 onward, for convenience of explanation, when ΔV is ΔV2 (see FIG. 16), ΔV2=L10·dI10/dt. Further, ΔV generated at the time of turn-on is a value determined by the same formula as ΔV1.

Therefore, when a comparator that compares ΔV with threshold value Vt (see FIG. 16) is adopted in determination circuit 261 of processing part 26 for overcurrent detection, threshold value Vt may be determined in advance so as to satisfy the condition of ΔV1<Vt<ΔV2.

Circuit 20 for a switching device according to the seventh exemplary embodiment can suppress a power loss, similarly to circuit 20 for a switching device according to the first exemplary embodiment.

In circuit 20 for a switching device according to the seventh exemplary embodiment, a specific operation of processing part 26 is an operation of performing overcurrent detection by comparing a voltage difference between voltage VL10 across common inductor L0 and voltage VL1 across first inductor L1 with threshold Vt. As a result, in circuit 20 for a switching device, since an absolute value of voltage VL10 across common inductor L10 is larger than an absolute value of voltage VL2 across second inductor L2, it is possible to suppress erroneous detection of overcurrent detection.

Eighth Exemplary Embodiment

Figure 17:
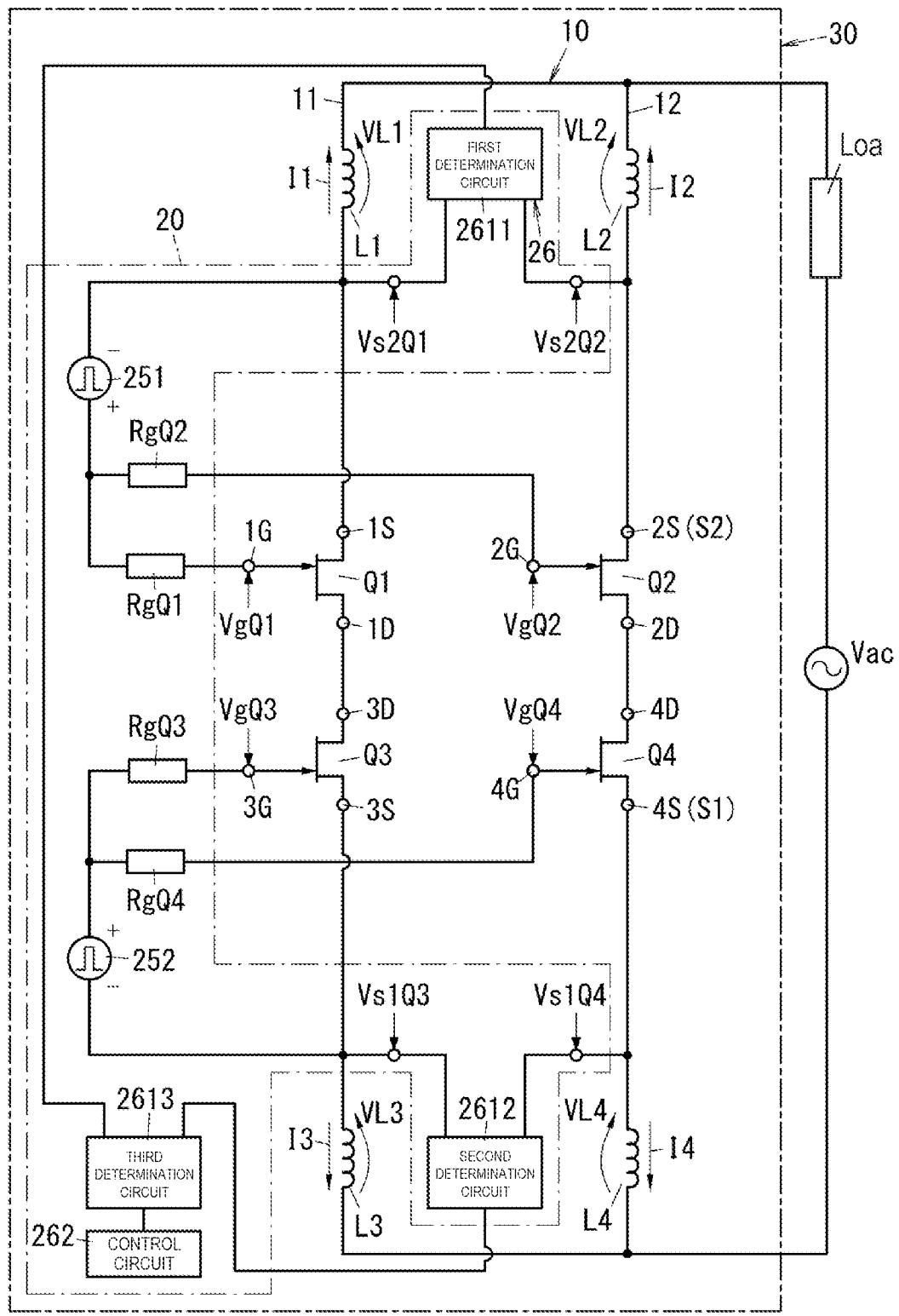
FIG. 17 is a circuit diagram of a switching system including a circuit for a switching device according to an eighth exemplary embodiment.

Hereinafter, switching system 30 including circuit 20 for a switching device according to an eighth exemplary embodiment will be described with reference to FIG. 17. FIG. 17 is a circuit diagram of switching system 30 including circuit 20 for a switching device according to the eighth exemplary embodiment.

In circuit 20 for a switching device and switching system 30 according to the eighth exemplary embodiment, the same reference signs are given to the same components as those of circuit 20 for a switching device and switching system 30 according to the first exemplary embodiment, and the description thereof is appropriately omitted.

First path 11 further includes third field effect transistor Q3 and third inductor L3. Third field effect transistor Q3 has gate 3G and source 3S, and is connected in anti-series to first field effect transistor Q1. Further, third field effect transistor Q3 has drain 3D. Third inductor L3 is connected to source 3S of third field effect transistor Q3.

Second path 12 further includes fourth field effect transistor Q4 and fourth inductor L4. Fourth field effect transistor Q4 has gate 4G and source 4S, and is connected in anti-series to second field effect transistor Q2. Fourth field effect transistor Q4 has drain 4D. Fourth inductor IA is connected to source 4S of fourth field effect transistor Q4.

Circuit 20 for a switching device further includes gate power supply 251, first gate resistor RgQ1, and second gate resistor RgQ2. First gate resistor RgQ1 is connected between gate power supply 251 and gate 1G of first field effect transistor Q1. Second gate resistor RgQ2 is connected between gate power supply 251 and gate 2G of second field effect transistor Q2. A resistance value of first gate resistor RgQ1 is larger than a resistance value of second gate resistor RgQ2. In circuit 20 for a switching device, a negative electrode of gate power supply 251 is connected to source 1S of first field effect transistor Q1. First gate voltage VgQ1 of first field effect transistor Q1 is smaller than second gate voltage VgQ2 of second field effect transistor Q2.

Circuit 20 for a switching device further includes gate power supply 252, third gate resistor RgQ3, and fourth gate resistor RgQ4. Third gate resistor RgQ3 is connected between gate power supply 252 and gate 3G of third field effect transistor Q3. Fourth gate resistor RgQ4 is connected between gate power supply 252 and gate 4G of fourth field effect transistor Q4. A resistance value of third gate resistor RgQ3 is larger than a resistance value of fourth gate resistor RgQ4. In circuit 20 for a switching device, a negative electrode of gate power supply 252 is connected to source 3S of third field effect transistor Q3. Third gate voltage VgQ3 of third field effect transistor Q3 is smaller than fourth gate voltage VgQ4 of fourth field effect transistor Q4.

In switching device 10 in switching system 30 according to the eighth exemplary embodiment, first field effect transistor Q1 and third field effect transistor Q3 constitute a first bidirectional switch. In switching device 10, second field effect transistor Q2 and fourth field effect transistor Q4 constitute a second bidirectional switch.

Further, in switching system 30 according to the eighth exemplary embodiment, power supply Vac connected to switching device 10 is an AC power supply.

Hereinafter, for convenience of description, regarding the first bidirectional switch, a state in which a voltage higher than or equal to a first threshold voltage is not applied between gate 1G and source 1S of first field effect transistor Q1 is also referred to as off-state of gate 1G. Further, a state in which a voltage higher than or equal to the first threshold voltage is applied between gate 1G and source 1S with gate 1G on a high potential side is also referred to as on-state of gate 1G.

Further, a state in which a voltage higher than or equal to a second threshold voltage is not applied between gate 2G and source 2S of second field effect transistor Q2 is also referred to as off-state of gate 2G. Further, a state in which a voltage higher than or equal to the second threshold voltage is applied between gate 2G and source 2S with gate 2G on a high potential side is also referred to as on-state of gate 2G.

Further, a state in which a voltage higher than or equal to a third threshold voltage is not applied between gate 3G and source 3S of third field effect transistor Q3 is also referred to as off-state of gate 3G. Further, a state in which a voltage higher than or equal to the third threshold voltage is applied between gate 3G and source 3S with gate 3G on a high potential side is also referred to as an on-state of gate 3G.

Further, a state in which a voltage higher than or equal to a fourth threshold voltage is not applied between gate 4G and source 4S of fourth field effect transistor Q4 is also referred to as off-state of gate 4G. Further, a state in which a voltage higher than or equal to the fourth threshold voltage is applied between gate 4G and source 4S with gate 4G on a high potential side is also referred to as on-state of gate 4G.

The first bidirectional switch can switch between a bidirectional on-state, a bidirectional off-state, a first diode state, and a second diode state according to a combination of first gate voltage VgQ1 and third gate voltage VgQ3 provided to each of gate 1G and gate 3G. The bidirectional on-state is a state where a bidirectional (a first direction and a second direction opposite to the first direction) current passes therethrough. The bidirectional off-state is a state where a bidirectional current is blocked. The first diode state is a state where a current in the first direction passes. The second diode state is a state where a current in the second direction passes.

The first bidirectional switch is in the bidirectional on-state when gate 1G is in the on-state and gate 3G is in the on-state. The first bidirectional switch is in the bidirectional off-state when gate 1G is in the off-state and gate 3G is in the off-state. The first bidirectional switch enters the first diode state when gate 1G is in the off-state and gate 3G is in the on-state. The first bidirectional switch enters the second diode state when gate 1G is in the on-state and gate 3G is in the off-state.

The second bidirectional switch can switch between the bidirectional on-state, the bidirectional off-state, the first diode state, and the second diode state according to a combination of second gate voltage VgQ2 and fourth gate voltage VgQ4 provided to each of gate 2G and gate 4G. The bidirectional on-state is a state where a bidirectional (a first direction and a second direction opposite to the first direction) current passes therethrough. The bidirectional off-state is a state where a bidirectional current is blocked. The first diode state is a state where a current in the first direction passes. The second diode state is a state where a current in the second direction passes.

The second bidirectional switch is in the bidirectional on-state when gate 2G is in the on-state and gate 4G is in the on-state. The second bidirectional switch is in the bidirectional off-state when gate 2G is in the off-state and gate 4G is in the off-state. The second bidirectional switch enters the first diode state when gate 2G is in the off-state and gate 4G is in the on-state. The second bidirectional switch enters the second diode state when gate 2G is in the on-state and gate 4G is in the off-state.

Processing part 26 executes a first specific operation and a second specific operation. The first specific operation is an operation performed according to voltage difference $\Delta V$ between voltage VL1 across first inductor L1 and voltage VL2 across second inductor L2, similarly to the specific operation described in the first exemplary embodiment. The second specific operation is an operation performed according to a voltage difference between voltage VL3 across third inductor L3 and voltage VL4 across fourth inductor L4, and is an operation similar to the first specific operation.

Processing part 26 includes first determination circuit 2611, second determination circuit 2612, third determination circuit 2613, and control circuit 262.

First determination circuit 2611 includes, for example, a comparator that compares voltage difference $\Delta V$ (=VL2−VL1) between voltage VL1 across first inductor L1 and voltage VL2 across second inductor L2 with a threshold, and when voltage difference $\Delta V$ becomes larger than the threshold, an output signal of the comparator changes from a first voltage level (low level) to a second voltage level (high level). The first voltage level of the output signal is a logical value 0, and the second voltage level is a logical value 1.

Second determination circuit 2612 includes, for example, a comparator that compares voltage difference $\Delta V$ (=VL4−VL3) between voltage VL3 across third inductor L3 and voltage VL4 across fourth inductor L4 with a threshold, and when voltage difference $\Delta V$ becomes larger than the threshold, an output signal of the comparator changes from a first voltage level (low level) to a second voltage level (high level). The first voltage level of the output signal is a logical value 0, and the second voltage level is a logical value 1.

Third determination circuit 2613 determines a direction of an overcurrent as shown in Table 1 below based on a determination result of first determination circuit 2611 and a determination result of second determination circuit 2612. Note that, in Table 1 below, S1 represents source 4S of fourth field effect transistor Q4, and S2 represents source 2S of second field effect transistor Q2. Further, Vs2Q1 in FIG. 17 is a potential of source 1S of first field effect transistor Q1, Vs2Q2 is a potential of source 2S of second field effect transistor Q2, Vs1Q3 is a potential of source 3S of third field effect transistor Q3, and Vs1Q4 is a potential of source 4S of fourth field effect transistor Q4.

TABLE 1

| First determination circuit | Second determination circuit | Determination result |
|---|---|---|
| 1 | 1 | No anomaly |
| 1 | 0 | S1 → S2 |
| 0 | 1 | S2 → S1 |
| 0 | 0 | No anomaly |

As shown in Table 1, third determination circuit 2613 determines that there is no anomaly when the logical value of the determination result of first determination circuit 2611 and the logical value of the determination result of second determination circuit 2612 are the same, and determines whether the overcurrent is flowing from S1 to S2 (S1→S2) or flowing from S2 to S1 (S2→S1) according to the combination when the logical value of the determination result of first determination circuit 2611 and the logical value of the determination result of second determination circuit 2612 are different from each other.

Control circuit 262 controls second field effect transistor Q2 and fourth field effect transistor Q4 based on the determination result of third determination circuit 2613.

When determining that the direction of the overcurrent is S1→S2, control circuit 262 turns off gate 2G of second field effect transistor Q2 and gate 1G of first field effect transistor Q1, and then turns off gate 4G of fourth field effect transistor Q4 and gate 3G of third field effect transistor Q3. Consequently, circuit 20 for a switching device can suppress heat generation of second field effect transistor Q2 and fourth field effect transistor Q4.

When determining that the direction of the overcurrent is S2→S1, control circuit 262 turns off gate 4G of fourth field effect transistor Q4 and gate 3G of third field effect transistor Q3, and then turns off gate 2G of second field effect transistor Q2 and gate 1G of first field effect transistor Q1. Consequently, circuit 20 for a switching device can suppress heat generation of second field effect transistor Q2 and fourth field effect transistor Q4.

Ninth Exemplary Embodiment

Figure 18:
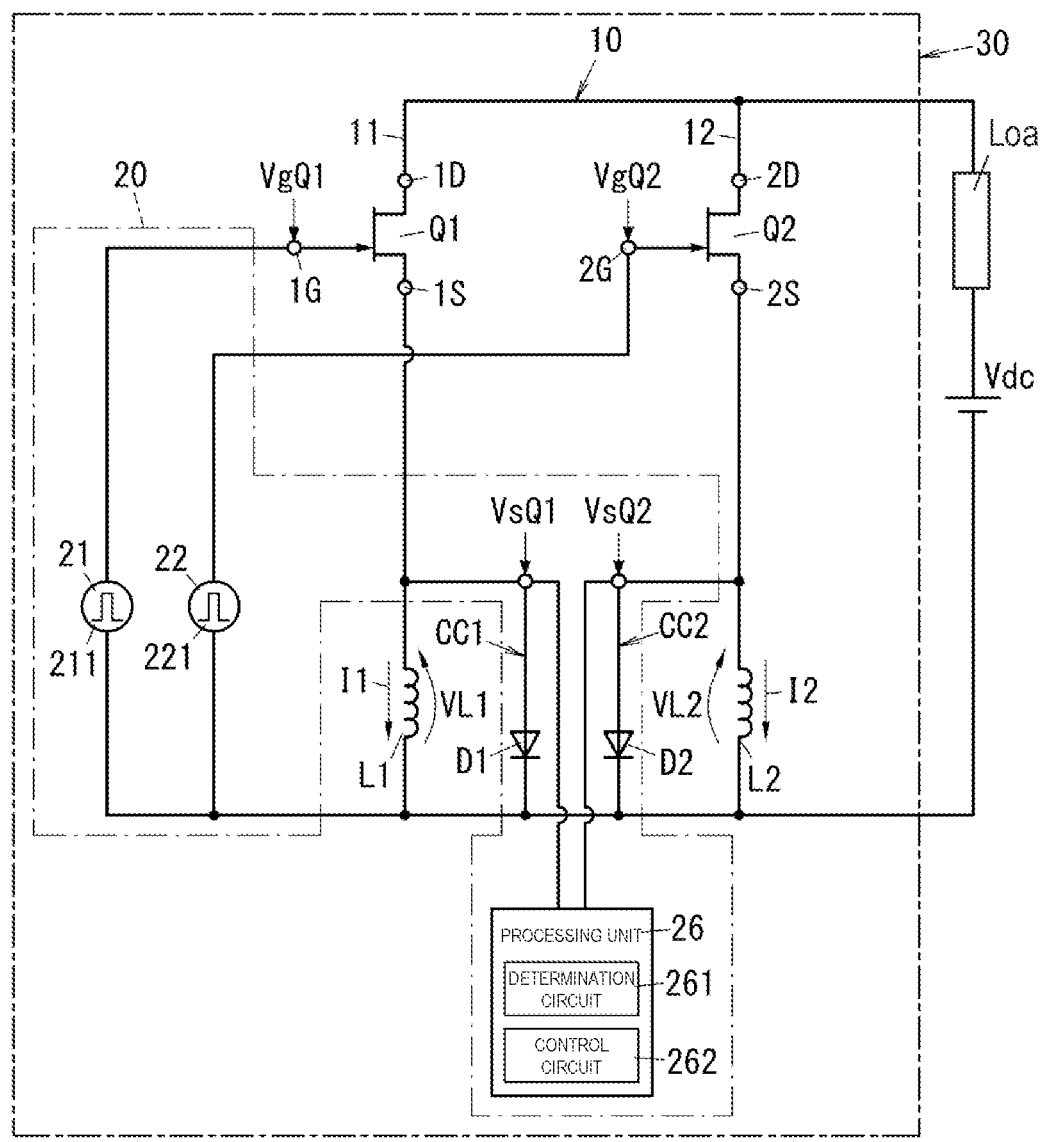
FIG. 18 is a circuit diagram of a switching system including a circuit for a switching device according to a ninth exemplary embodiment.
Figure 19:
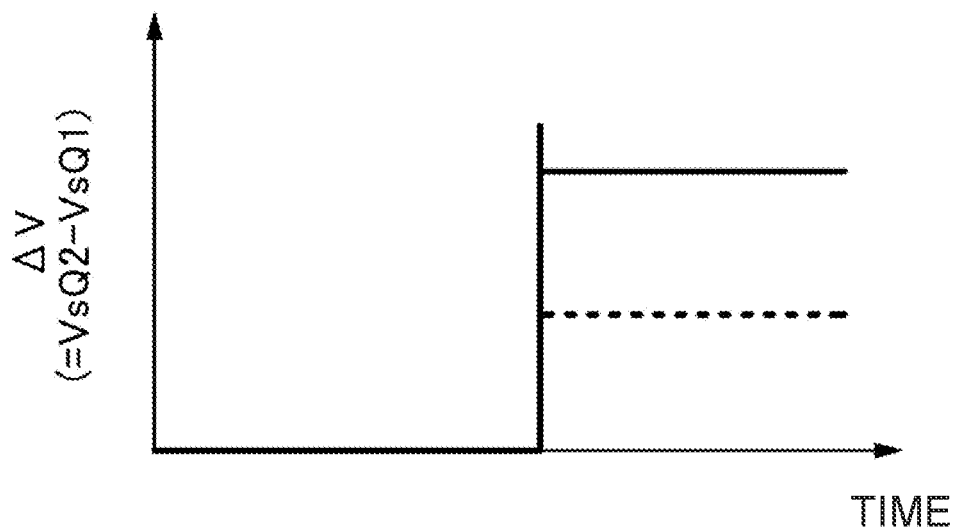
FIG. 19 is an operation explanatory diagram of the switching system including the above-described circuit for a switching device.

Hereinafter, switching system 30 including circuit 20 for a switching device according to a ninth exemplary embodiment will be described with reference to FIGS. 18 and 19. FIG. 18 is a circuit diagram of switching system 30 including circuit 20 for a switching device according to the ninth exemplary embodiment. FIG. 19 is a diagram for explaining an operation of switching system 30 including circuit 20 for a switching device according to the ninth exemplary embodiment.

In circuit 20 for a switching device and switching system 30 according to the ninth exemplary embodiment, the same reference signs are given to the same components as those of circuit 20 for a switching device and switching system 30 according to the first exemplary embodiment, and the description thereof is appropriately omitted.

Circuit 20 for a switching device according to the ninth exemplary embodiment is different from circuit 20 for a switching device according to the first exemplary embodiment in further including first clamp circuit CC1 and second clamp circuit CC2.

First clamp circuit CC1 is connected in parallel to first inductor L1 and clamps voltage VL1 across first inductor L1. First clamp circuit CC1 is configured by diode D1, but is not limited thereto, and may be configured by, for example, a Zener diode.

Second clamp circuit CC2 is connected in parallel to second inductor L2 and clamps voltage VL2 across second inductor L2. Second clamp circuit CC2 is configured by diode D2, but is not limited thereto, and may be configured by, for example, a Zener diode.

In circuit 20 for a switching device according to the ninth exemplary embodiment, when anomaly occurs, as illustrated in FIG. 19, voltage difference $\Delta V$ (=VsQ2−VsQ1) can be clamped to a voltage indicated by a broken line having a voltage level smaller than a voltage at a level indicated by a solid line.

Circuit 20 for a switching device according to the ninth exemplary embodiment can suppress variations in voltage VL1 due to variations in inductance or the like of first inductor L1 in a state before a source current (first current I1) of first field effect transistor Q1 is saturated.

Further, since circuit 20 for a switching device according to the ninth exemplary embodiment includes first clamp circuit CC1 and second clamp circuit CC2, it is possible to suppress an input of the comparator from becoming too large when the comparator is used in determination circuit 261. Further, in circuit 20 for a switching device according to the ninth exemplary embodiment, it is possible to suppress second field effect transistor Q2 from being turned off.

Tenth Exemplary Embodiment

Figure 20:
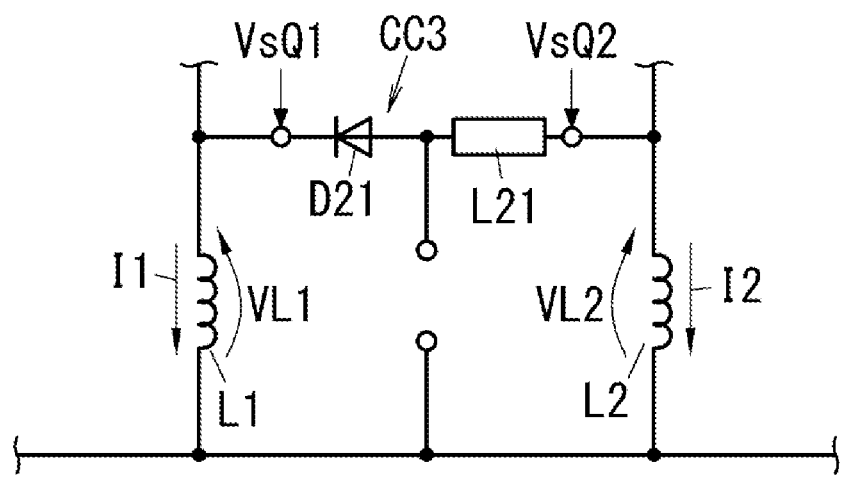
FIG. 20 is a circuit diagram of a main part in a switching system including a circuit for a switching device according to a tenth exemplary embodiment.

Hereinafter, switching system 30 including circuit 20 for a switching device according to a tenth exemplary embodiment will be described with reference to FIG. 20. FIG. 20 is a circuit diagram of a main part of switching system 30 including circuit 20 for a switching device according to the tenth exemplary embodiment.

Since the basic configuration of circuit 20 for a switching device and switching system 30 according to the tenth exemplary embodiment is similar to that of circuit 20 for a switching device and switching system 30 according to the first exemplary embodiment, a part of the circuit diagram is not illustrated. Note that the same components as those of circuit 20 for a switching device and switching system 30 according to the first exemplary embodiment are denoted by the same reference signs, and the description thereof will be appropriately omitted.

Circuit 20 for a switching device according to the tenth exemplary embodiment is different from circuit 20 for a switching device according to the first exemplary embodiment in further including clamp circuit CC3.

Clamp circuit CC3 clamps a voltage difference between voltage VL1 across first inductor L1 and voltage VL2 across second inductor L2. Here, clamp circuit CC3 includes a series circuit of inductor L21 and diode D21 connected between source 2S of second field effect transistor Q2 and source 1S of first field effect transistor Q1. An anode of diode D21 is connected to a connection point between source 2S of second field effect transistor Q2 and second inductor L2 via inductor L21. A cathode of diode D21 is connected to a connection point between source 1S of first field effect transistor Q1 and first inductor L1. When a forward voltage of diode D21 is Vf, clamp circuit CC3 can set a potential of the anode of diode D21 to VsQ1+Vf. In circuit 20 for a switching device according to the tenth exemplary embodiment, a predetermined operation is executed based on a potential difference between VsQ1+Vf and the reference potential.

Circuit 20 for a switching device according to the tenth exemplary embodiment includes clamp circuit CC3, thereby making it possible to suppress an input of the comparator from becoming too large, for example, when the comparator is used in determination circuit 261.

Modification Example of Tenth Exemplary Embodiment

Figure 21:
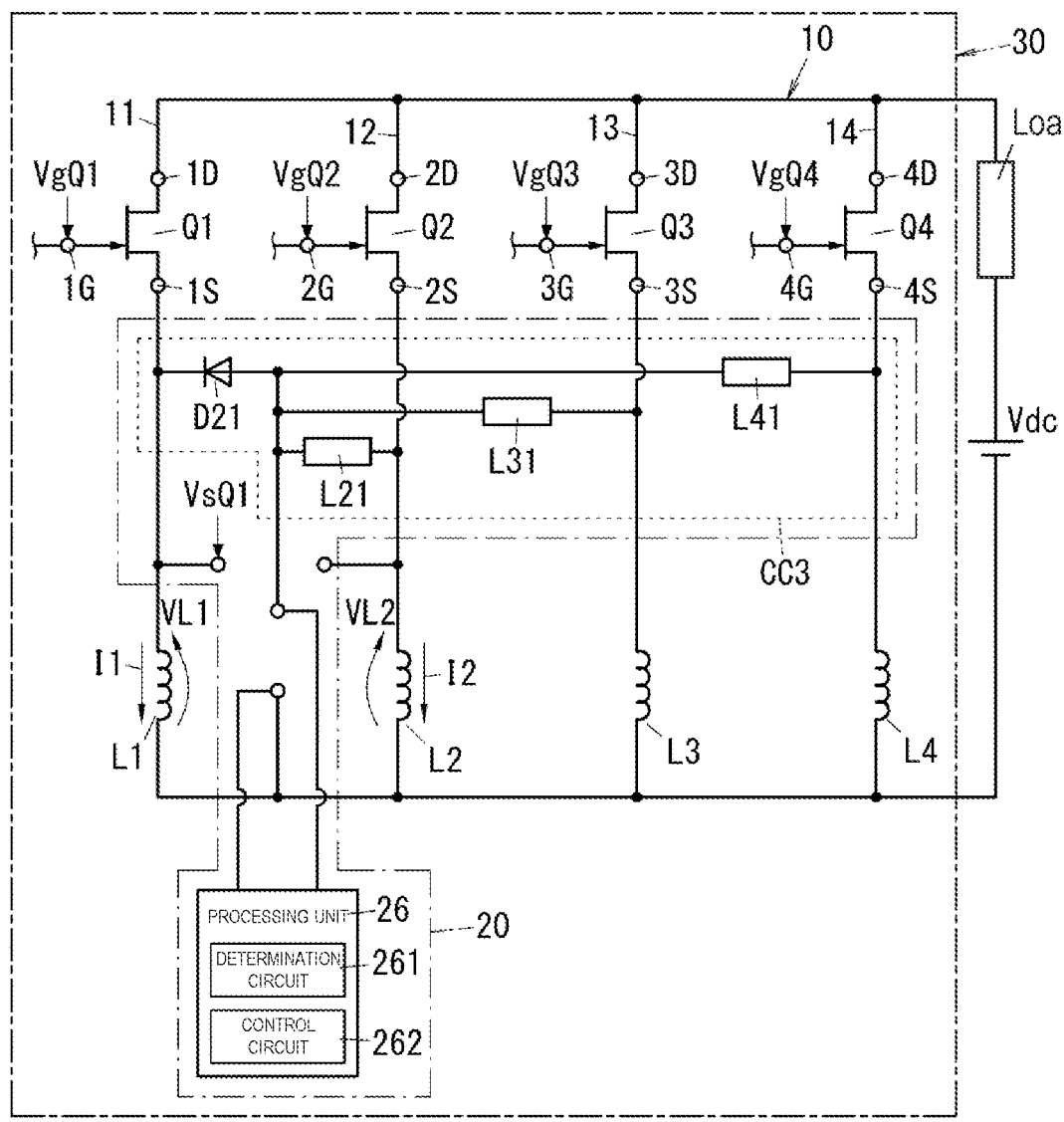
FIG. 21 is a circuit diagram of a switching system including a circuit for a switching device according to a modification example of the tenth exemplary embodiment.

Hereinafter, switching system 30 including circuit 20 for a switching device according to a modification example of the tenth exemplary embodiment will be described with reference to FIG. 21. FIG. 21 is a circuit diagram of switching system 30 including circuit 20 for a switching device according to the modification example of the tenth exemplary embodiment.

In circuit 20 for a switching device and switching system 30 according to the modification example of the tenth exemplary embodiment, the same reference signs are given to the same components as those of circuit 20 for a switching device and switching system 30 according to the tenth exemplary embodiment, and the description thereof is appropriately omitted.

Switching device 10 to which circuit 20 for a switching device according to the modification example of the tenth exemplary embodiment is applied is different from circuit 20 for a switching device according to the tenth exemplary embodiment in further including third path 13 and fourth path 14 in addition to first path 11 and second path 12. Third path 13 and fourth path 14 are connected in parallel with first path 11 and second path 12.

Third path 13 includes third field effect transistor Q3 and third inductor L3 connected in series with third field effect transistor Q3. Third field effect transistor Q3 has gate 3G, source 3S, and drain 3D. Source 3S of third field effect transistor Q3 is connected to third inductor L3. For example, third gate voltage VgQ3 is applied from third drive circuit (not illustrated) to gate 3G of third field effect transistor Q3.

Fourth path 14 includes fourth field effect transistor Q4 and fourth inductor L4 connected in series with fourth field effect transistor Q4. Fourth field effect transistor Q4 has gate 4G, source 4S, and drain 4D. Source 4S of fourth field effect transistor Q4 is connected to fourth inductor L4. For example, fourth gate voltage VgQ4 is applied from fourth drive circuit (not illustrated) to gate 4G of fourth field effect transistor Q4.

Further, in circuit 20 for a switching device according to the modification example of the tenth exemplary embodiment, a connection point between source 3S of third field effect transistor Q3 and third inductor L3 is connected to the anode of diode D21 via inductor L31. Further, a connection point between source 4S of fourth field effect transistor Q4 and fourth inductor L4 is connected to the anode of diode D21 via inductor L41. Circuit 20 for a switching device according to the modification example of the tenth exemplary embodiment can suppress variations in the current flowing through each of first inductor L1 to fourth inductor L4, and can be expected to stabilize the operation.

Eleventh Exemplary Embodiment

Figure 22:
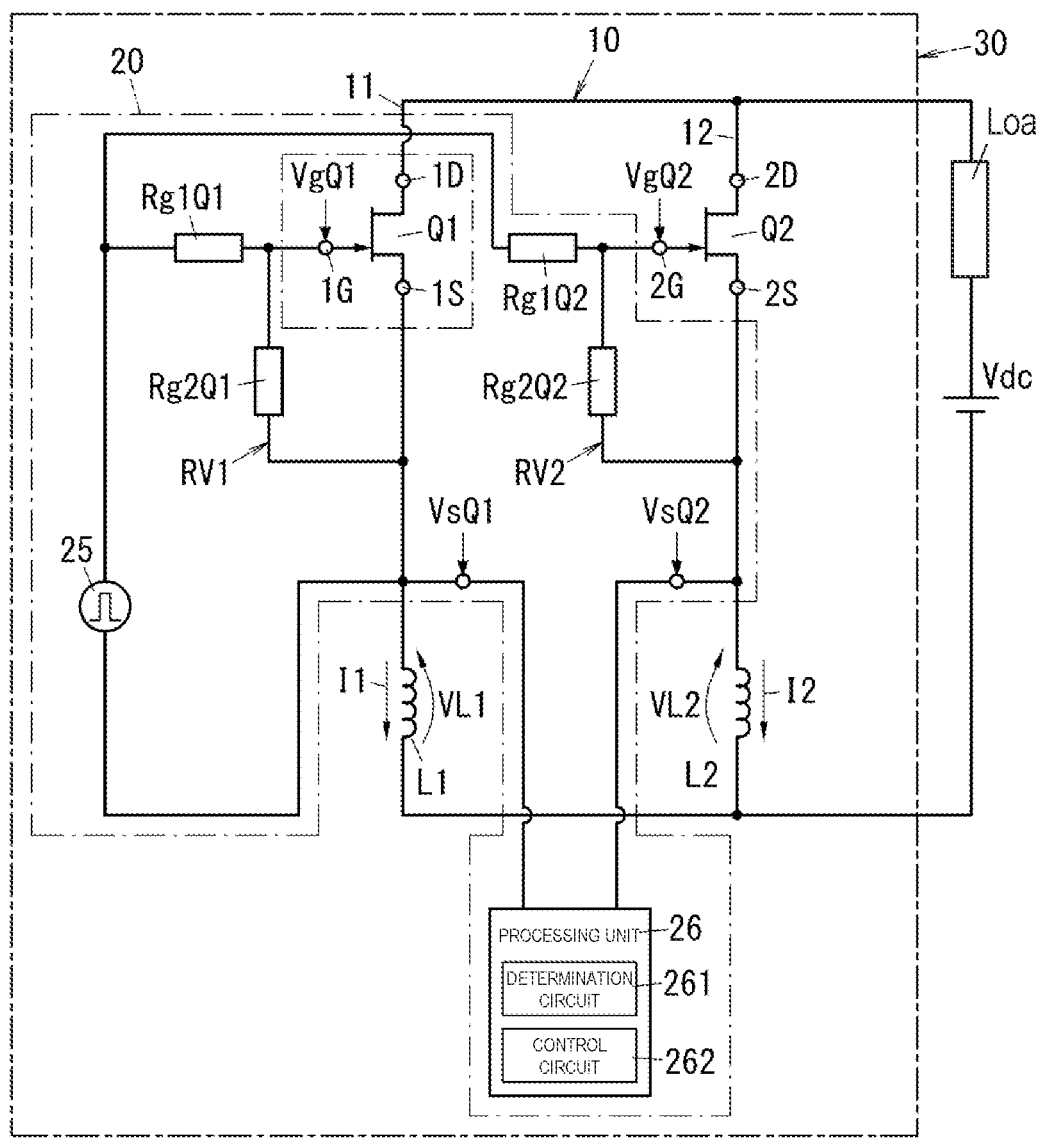
FIG. 22 is a circuit diagram of a switching system including a circuit for a switching device according to an eleventh exemplary embodiment.

Hereinafter, switching system 30 including circuit 20 for a switching device according to an eleventh exemplary embodiment will be described with reference to FIG. 22. FIG. 22 is a circuit diagram of switching system 30 including circuit 20 for a switching device according to the eleventh exemplary embodiment.

In circuit 20 for a switching device and switching system 30 according to the eleventh exemplary embodiment, the same components as those of circuit 20 for a switching device and switching system 30 (see FIG. 14) according to the sixth exemplary embodiment are denoted by the same reference signs, and the description thereof is appropriately omitted.

Circuit 20 for a switching device according to the eleventh exemplary embodiment further includes a gate power supply 25, first resistance voltage dividing circuit RV1, and second resistance voltage dividing circuit RV2. First resistance voltage dividing circuit RV1 is connected between a positive electrode of gate power supply 25 and source 1S of first field effect transistor Q1. First resistance voltage dividing circuit RV1 includes a series circuit of resistor Rg1Q1 and resistor Rg2Q1. Second resistance voltage dividing circuit RV2 is connected between the positive electrode of the gate power supply 25 and source 2S of second field effect transistor Q2. An output end (a connection point between resistors Rg1Q1 and Rg2Q1) of first resistance voltage dividing circuit RV1 is connected to gate 1G of first field effect transistor Q1. Second resistance voltage dividing circuit RV2 includes a series circuit of resistor Rg1Q2 and resistor Rg2Q2. An output end (a connection point between resistors Rg1Q2 and Rg2Q2) of second resistance voltage dividing circuit RV2 is connected to gate 2G of second field effect transistor Q2.

In circuit 20 for a switching device according to the eleventh exemplary embodiment, first gate voltage VgQ1 of first field effect transistor Q1 and second gate voltage VgQ2 of second field effect transistor Q2 can be made different from each other.

Twelfth Exemplary Embodiment

Figure 23:
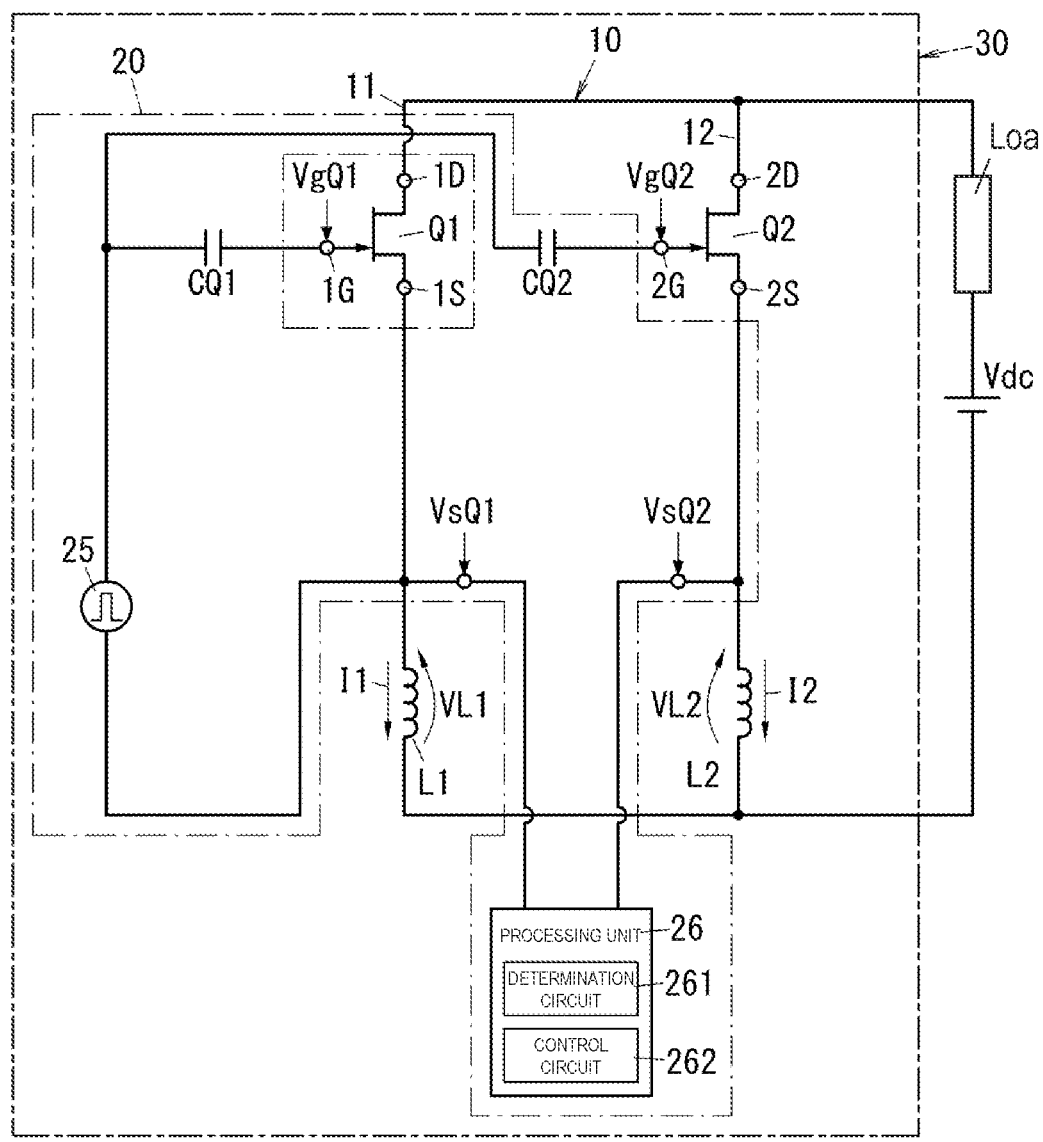
FIG. 23 is a circuit diagram of a switching system including a circuit for a switching device according to a twelfth exemplary embodiment.

Hereinafter, switching system 30 including circuit 20 for a switching device according to a twelfth exemplary embodiment will be described with reference to FIG. 23. FIG. 23 is a circuit diagram of switching system 30 including circuit 20 for a switching device according to the twelfth exemplary embodiment.

In circuit 20 for a switching device and switching system 30 according to the twelfth exemplary embodiment, the same components as those of circuit 20 for a switching device and switching system 30 (see FIG. 14) according to the sixth exemplary embodiment are denoted by the same reference signs, and the description thereof is appropriately omitted.

First field effect transistor Q1 and second field effect transistor Q2 are MOSFETs or normally-on JFETs. Circuit 20 for a switching device further includes gate power supply 25, first capacitor CQ1, and second capacitor CQ2. First capacitor CQ1 is connected between a positive electrode of gate power supply 25 and gate 1G of first field effect transistor Q1. Second capacitor CQ2 is connected between a positive electrode of gate power supply 25 and gate 2G of second field effect transistor Q2.

In circuit 20 for a switching device according to the twelfth exemplary embodiment, first gate voltage VgQ1 of first field effect transistor Q1 and second gate voltage VgQ2 of second field effect transistor Q2 can be made different from each other.

Thirteenth Exemplary Embodiment

Figure 24:
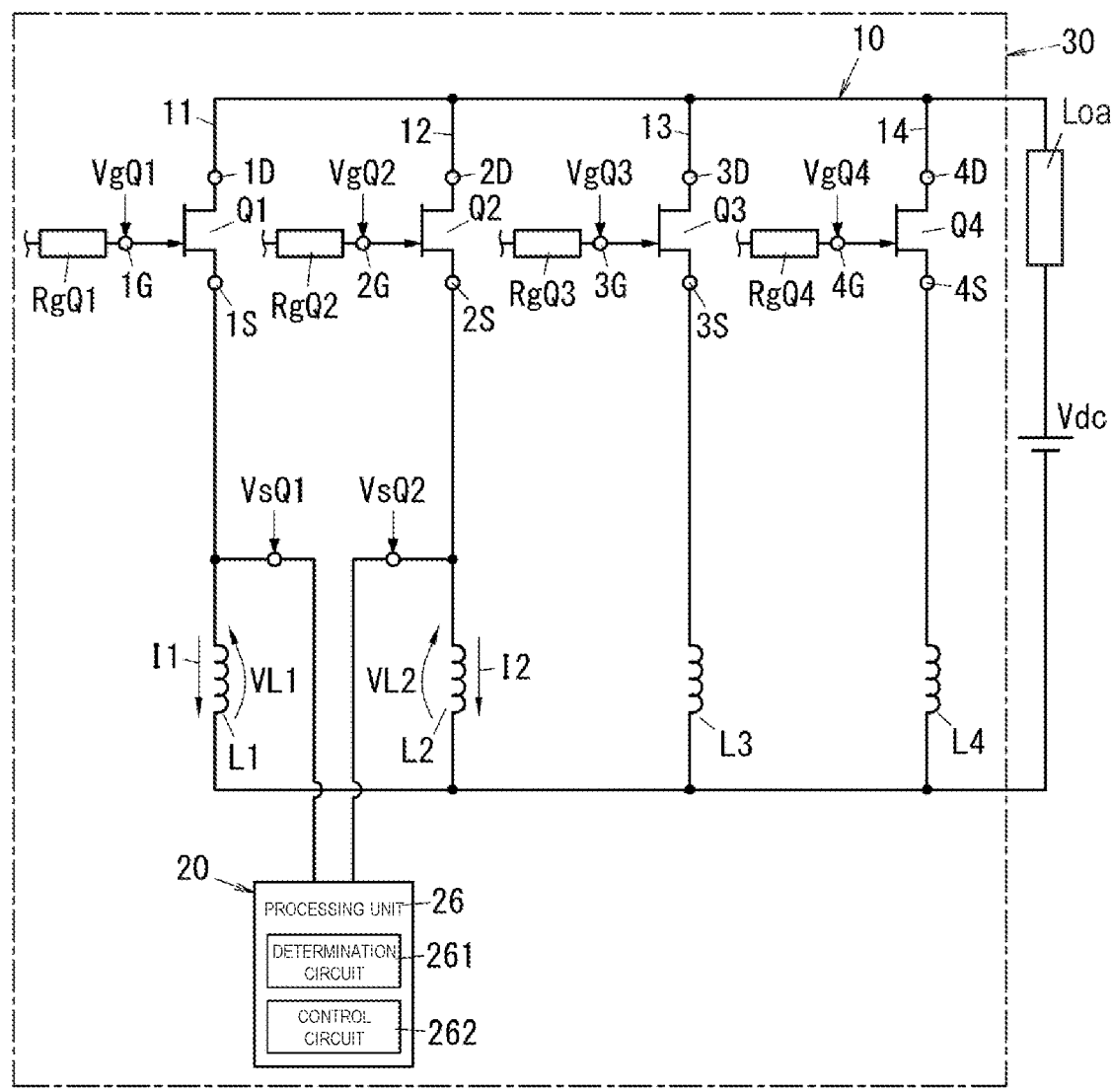
FIG. 24 is a circuit diagram of a switching system including a circuit for a switching device according to a thirteenth exemplary embodiment.

Hereinafter, switching system 30 including circuit 20 for a switching device according to a thirteenth exemplary embodiment will be described with reference to FIG. 24. FIG. 24 is a circuit diagram of switching system 30 including circuit 20 for a switching device according to the thirteenth exemplary embodiment.

In circuit 20 for a switching device and switching system 30 according to the thirteenth exemplary embodiment, the same components as those of circuit 20 for a switching device and switching system 30 according to the fourth exemplary embodiment described with reference to FIG. 11 are denoted by the same reference signs, and the description thereof is appropriately omitted.

Circuit 20 for a switching device according to the thirteenth exemplary embodiment is different from circuit 20 for a switching device according to the fourth exemplary embodiment in that switching device 10 to which circuit 20 for a switching device is applied further includes third path 13 and fourth path 14 in addition to first path 11 and second path 12. Third path 13 and fourth path 14 are connected in parallel with first path 11 and second path 12.

Further, circuit 20 for a switching device according to the thirteenth exemplary embodiment is different from circuit 20 for a switching device according to the first exemplary embodiment in further including first gate resistor RgQ1, second gate resistor RgQ2, third gate resistor RgQ3, and fourth gate resistor RgQ4.

First gate voltage VgQ1 is applied to gate 1G of first field effect transistor Q1 from gate power supply 25 via first gate resistor RgQ1.

Second gate voltage VgQ2 is applied to gate 2G of second field effect transistor Q2 from gate power supply 25 via second gate resistor RgQ2.

Third path 13 includes third field effect transistor Q3 and third inductor L3 connected in series with third field effect transistor Q3. Third field effect transistor Q3 has gate 3G, source 3S, and drain 3D. Source 3S of third field effect transistor Q3 is connected to third inductor L3. For example, third gate voltage VgQ3 is applied to gate 3G of third field effect transistor Q3 from gate power supply 25 via third gate resistor RgQ3.

Fourth path 14 includes fourth field effect transistor Q4 and fourth inductor L4 connected in series with fourth field effect transistor Q4. Fourth field effect transistor Q4 has gate 4G, source 4S, and drain 4D. Source 4S of fourth field effect transistor Q4 is connected to fourth inductor L4. For example, fourth gate voltage VgQ4 is applied to gate 4G of fourth field effect transistor Q4 from gate power supply 25 via fourth gate resistor RgQ4.

In switching system 30 including circuit 20 for a switching device according to the thirteenth exemplary embodiment, it is possible to suppress the power loss similarly to circuit 20 for a switching device according to the fourth exemplary embodiment.

Modification Example

The foregoing first to thirteenth exemplary embodiments are merely one of various embodiments of the present disclosure. The above-described first to thirteenth exemplary embodiments can be variously modified according to design and the like as long as the object of the present disclosure can be achieved.

For example, the trigger at the time of performing the predetermined operation is not limited to a change determined by the comparison between voltage difference ΔV and a threshold, and may include a change determined by a change amount of voltage difference ΔV.

Further, in the determination circuit, determining that the overcurrent is flowing includes a case where the output of the determination circuit is different between when the overcurrent is flowing and when the overcurrent is not flowing.

Further, the p-type layer in the GaN-based GIT is not limited to the p-type AlGaN layer, and may be, for example, a p-type GaN layer or a p-type metal oxide semiconductor layer. The p-type metal oxide semiconductor layer is, for example, a NiO layer. For example, the NiO layer may contain, as an impurity, at least one alkali metal selected from the group of lithium, sodium, potassium, rubidium, and cesium. Further, the NiO layer may contain, for example, a transition metal such as silver or copper that becomes monovalent when added as an impurity.

The GaN-based GIT may include one or more nitride semiconductor layers between the buffer layer and the first nitride semiconductor layer. Further, the buffer layer is not limited to a single layer structure, and may have, for example, a superlattice structure.

Further, the substrate in the GaN-based GIT is not limited to a silicon substrate, and may be, for example, a GaN substrate, a SiC substrate, a sapphire substrate, or the like. Switching device 10 can be applied to, for example, a circuit breaker.

Aspects

The following aspects are disclosed based on the above-described exemplary embodiments and the like in this specification.

Circuit (20) for a switching device according to a first aspect is used in switching device (10). Switching device (10) includes first path (11) and second path (12). First path (11) includes first field effect transistor (Q1) and first inductor (L1). First field effect transistor (Q1) has gate (1G) and source (1S). First inductor (L1) is connected to source (1S) of first field effect transistor (Q1). Second path (12) includes second field effect transistor (Q2) and second inductor (L2). Second field effect transistor (Q2) has gate (2G) and source (2S). Second inductor (L2) is connected to source (2S) of second field effect transistor (Q2). First path (11) and second path (12) are connected in parallel to power supply (Vdc). First maximum current (ImQ1) that is a maximum current during conduction of first field effect transistor (Q1) is smaller than second maximum current (ImQ2) that is a maximum current during conduction of second field effect transistor (Q2). Circuit (20) for a switching device includes processing part (26). Processing part (26) executes a specific operation according to voltage difference (ΔV) between voltage (VL1) across first inductor (L1) and a voltage across second inductor (VL2).

Circuit (20) for a switching device according to the first aspect can suppress a power loss.

In circuit (20) for a switching device according to a second aspect, in the first aspect, processing part (26) operates with a trigger that first current (I1) flowing through first path (11) and second current (I2) flowing through second path (12) become larger than or equal to first maximum current (ImQ1) from a current value less than first maximum current (ImQ1).

In circuit (20) for a switching device according to the second aspect, it is possible to suppress the occurrence of malfunction.

In circuit (20) for a switching device according to a third aspect, in the first or second aspect, the specific operation includes an operation of determining that an overcurrent is flowing through switching device (10) when there is a predetermined change in voltage difference (ΔV).

In circuit (20) for a switching device according to the third aspect, it is possible to detect that an overcurrent is flowing through switching device (10).

In circuit (20) for a switching device according to a fourth aspect, in any one of the first to third aspects, gate voltage (Vgon1) of first field effect transistor (Q1) during the conduction is smaller than gate voltage (Vgon2) of second field effect transistor (Q2) during the conduction.

In circuit (20) for a switching device according to the fourth aspect, first maximum current (ImQ1) of first field effect transistor (Q1) can be made smaller than second maximum current (ImQ2).

In circuit (20) for a switching device according to a fifth aspect, in any one of the first to fourth aspects, first inductor (L1) has an inductance smaller than an inductance of second inductor (L2).

In circuit (20) for a switching device according to the fifth aspect, current change rate (dI1/dt) of first current (I1) when an overcurrent flows through switching device (10) can be made larger than current change rate (dI2/dt) of second current (I2).

In circuit (20) for a switching device according to a sixth aspect, in any one of the first to fifth aspects, an on-resistance of first field effect transistor (Q1) and an on-resistance of second field effect transistor (Q2) are different from each other.

In circuit (20) for a switching device according to the sixth aspect, the on-resistance of first field effect transistor (Q1) and the on-resistance of second field effect transistor (Q2) are made different from each other, so that first maximum current (ImQ1) of first field effect transistor (Q1) and second maximum current (ImQ2) of second field effect transistor (Q2) can be made different from each other.

In any one of the first to sixth aspects, circuit (20) for a switching device according to a seventh aspect further includes first drive circuit (21) and second drive circuit (22). First drive circuit (21) includes first gate power supply (211) connected to gate (1G) of first field effect transistor (Q1), and drives first field effect transistor (Q1). Second drive circuit (22) includes second gate power supply (221) connected to gate (2G) of second field effect transistor (Q2), and drives second field effect transistor (Q2). A negative electrode of first gate power supply (211) is connected to source (1S) of first field effect transistor (Q1). A negative electrode of second gate power supply (221) is connected to source (2S) of second field effect transistor (Q2).

In circuit (20) for a switching device according to the seventh aspect, first gate voltage (VgQ1) is less likely to be affected by voltage (VL1) of first inductor (L1), and second gate voltage (VgQ2) is less likely to be affected by voltage (VL2) of second inductor (L2).

In circuit (20) for a switching device according to an eighth aspect, in any one of the first to sixth aspects, each of first field effect transistor (Q1) and second field effect transistor (Q2) is a junction field effect transistor. Circuit (20) for a switching device further includes gate power supply (25), first gate resistor (RgQ1), and second gate resistor (RgQ2). First gate resistor (RgQ1) is connected between gate power supply (25) and gate (1G) of first field effect transistor (Q1). Second gate resistor (RgQ2) is connected between gate power supply (25) and gate (2G) of second field effect transistor (Q2). A resistance value of first gate resistor (RgQ1) is larger than a resistance value of second gate resistor (RgQ2).

In circuit (20) for a switching device according to the eighth aspect, a first gate current flowing through gate (1G) of first field effect transistor (Q1) is smaller than a second gate current flowing through gate (2G) of second field effect transistor (Q2). Therefore, in circuit (20) for a switching device according to the eighth aspect, first gate voltage (VgQ1) when first field effect transistor (Q1) is turned on is smaller than second gate voltage (VgQ2) when second field effect transistor (Q2) is turned on.

In circuit (20) for a switching device according to a ninth aspect, in one of the first to sixth aspects, the specific operation includes an operation of limiting a current flowing through second field effect transistor (Q2).

In circuit (20) for a switching device according to the ninth aspect, it is possible to suppress an overcurrent of second field effect transistor (Q2).

In the ninth aspect, circuit (20) for a switching device according to a tenth aspect further includes first drive circuit (21) and second drive circuit (22). First drive circuit (21) includes first gate power supply (211) connected to gate (1G) of first field effect transistor Q1, and drives first field effect transistor (Q1). Second drive circuit (22) includes second gate power supply (221) connected to gate (2G) of second field effect transistor (Q2), and drives second field effect transistor (Q2). A negative electrode of first gate power supply (211) and a negative electrode of second gate power supply (221) are connected to source (1S) of first field effect transistor (Q1).

Circuit (20) for a switching device according to the tenth aspect can suppress an overcurrent of second field effect transistor (Q2).

In circuit (20) for a switching device according to an eleventh aspect, in the ninth aspect, each of first field effect transistor (Q1) and second field effect transistor (Q2) is a junction field effect transistor. Circuit (20) for a switching device further includes gate power supply (25), first gate resistor (RgQ1), and second gate resistor (RgQ2). First gate resistor (RgQ1) is connected between gate power supply (25) and gate (1G) of first field effect transistor (Q1). Second gate resistor (RgQ2) is connected between gate power supply (25) and gate (2G) of second field effect transistor (Q2). A resistance value of first gate resistor (RgQ1) is larger than a resistance value of second gate resistor (RgQ2). A negative electrode of gate power supply (25) is connected to source (1S) of first field effect transistor (Q1).

In circuit (20) for a switching device according to the eleventh aspect, it is possible to suppress an overcurrent of second field effect transistor (Q2).

In the first aspect, circuit (20) for a switching device according to a twelfth aspect further includes common inductor (L0). In common inductor (L0), first inductor (L1) and second inductor (L2) are connected in common. A specific operation is an operation of performing overcurrent detection by comparing a voltage difference between voltage (VL10) across common inductor (L10) and voltage (VL1) across first inductor (L1) with a threshold value.

Circuit (20) for a switching device according to the twelfth aspect can suppress erroneous detection of overcurrent detection.

In circuit (20) for a switching device according to a thirteenth aspect, in any one of the first to eleventh aspects, first path (11) further includes third field effect transistor (Q3) and third inductor (L3). Third field effect transistor (Q3) has gate (3G) and source (3S), and is connected in anti-series to first field effect transistor (Q1). Third inductor (L3) is connected to source (3S) of third field effect transistor (Q3). Second path (12) further includes fourth field effect transistor (Q4) and fourth inductor (L4). Fourth field effect transistor (Q4) has gate (4G) and source (4S), and is connected in anti-series to second field effect transistor (Q2).

Fourth inductor (L4) is connected to source (4S) of fourth field effect transistor (Q4). Processing part (26) includes first determination circuit (2611) and second determination circuit (2612). First determination circuit (2611) determines presence or absence of an overcurrent in switching device (10) in accordance with a voltage difference between voltage (VL2) across second inductor (L2) and voltage (VL1) across first inductor (L1). Second determination circuit (2612) determines presence or absence of an overcurrent in switching device (10) in accordance with a voltage difference between voltage (VL3) across third inductor (L3) and voltage (VL4) across fourth inductor (L4).

In circuit (20) for a switching device according to a fourteenth aspect, in the thirteenth aspect, processing part (26) further includes third determination circuit (2613) and control circuit (262). Third determination circuit (2613) determines a direction in which an overcurrent is flowing based on a determination result of first determination circuit (2611) and a determination result of second determination circuit (2612). Control circuit (262) controls first field effect transistor (Q1) and second field effect transistor (Q2) based on a determination result of third determination circuit (2613).

Circuit (20) for a switching device according to the fourteenth aspect can control first field effect transistor Q1 and second field effect transistor Q2 on the basis of the direction of the overcurrent.

In any one of the first to fourteenth aspects, circuit (20) for a switching device according to a fifteenth aspect further includes first clamp circuit (CC1) and second clamp circuit (CC2). First clamp circuit (CC1) is connected in parallel to first inductor (L1) and clamps voltage (VL1) across first inductor (L1). Second clamp circuit (CC2) is connected in parallel to second inductor (L2) and clamps voltage (VL2) across second inductor (L2).

Circuit (20) for a switching device according to the fifteenth aspect can suppress variations in voltage (VL1) due to variations in inductance or the like of first inductor (L1) in a state before a source current of first field effect transistor (Q1) is saturated.

In any one of the first to fourteenth aspects, circuit (20) for a switching device according to a sixteenth aspect further includes a clamp circuit (CC3). Clamp circuit (CC3) clamps a voltage difference between voltage (VL1) across first inductor (L1) and voltage (VL2) across second inductor (L2).

Circuit (20) for a switching device according to the sixteenth aspect can suppress an excessive increase in the voltage difference between voltage (VL1) across first inductor (L1) and voltage (VL2) across second inductor (L2).

In any one of the first to sixth aspects, circuit (20) for a switching device according to a seventeenth aspect further includes gate power supply (25), first resistance voltage dividing circuit (RV1), and second resistance voltage dividing circuit (RV2). First resistance voltage dividing circuit (VR1) is connected between a positive electrode of gate power supply (25) and source (1S) of first field effect transistor (Q1). Second resistance voltage dividing circuit (RV2) is connected between the positive electrode of gate power supply (25) and source (2S) of second field effect transistor (Q2). An output end of first resistance voltage dividing circuit (RV1) is connected to gate (1G) of first field effect transistor (Q1). An output end of second resistance voltage dividing circuit (RV2) is connected to gate (2G) of second field effect transistor (Q2).

In circuit (20) for a switching device according to the seventeenth aspect, first gate voltage (VgQ1) of first field effect transistor (Q1) and second gate voltage (VgQ2) of second field effect transistor (Q2) can be made different from each other.

In circuit (20) for a switching device according to an eighteenth aspect, in any one of the first to sixth aspects, each of first field effect transistor (Q1) and second field effect transistor (Q2) is a MOSFET or a normally-on JFET. Circuit (20) for a switching device further includes gate power supply (25), first capacitor (CQ1), and second capacitor (CQ2). First capacitor (CQ1) is connected between a positive electrode of gate power supply (25) and gate (1G) of first field effect transistor (Q1). Second capacitor (CQ2) is connected between the positive electrode of gate power supply (25) and gate (2G) of second field effect transistor (Q2).

In circuit (20) for a switching device according to the eighteenth aspect, first gate voltage (VgQ1) of first field effect transistor (Q1) and second gate voltage (VgQ2) of second field effect transistor (Q2) can be made different from each other.

Switching system (30) according to a nineteenth aspect includes circuit (20) for a switching device according to any one of the first to eighteenth aspects, and switching device (10).

Switching system (30) according to the nineteenth aspect can suppress a power loss.

A processing method according to a twentieth aspect is used for switching device (10). Switching device (10) includes first path (11) and second path (12). First path (11) includes first field effect transistor (Q1) and first inductor (L1). First field effect transistor (Q1) has gate (1G) and source (1S). First inductor (L1) is connected to source (1S) of first field effect transistor (Q1). Second path (12) includes second field effect transistor (Q2) and second inductor (L2). Second field effect transistor (Q2) has gate (2G) and source (2S). Second inductor (L2) is connected to source (2S) of second field effect transistor (Q2). First path (11) and second path (12) are connected in parallel to power supply (Vdc). First maximum current (ImQ1) that is a maximum current during conduction of first field effect transistor (Q1) is smaller than second maximum current (ImQ2) that is a maximum current during conduction of second field effect transistor (Q2). In the processing method, a specific operation is executed according to voltage difference (ΔV) between voltage (VL1) across first inductor (L1) and voltage (VL2) across second inductor (L2).

The processing method according to the twentieth aspect can suppress a power loss.

INDUSTRIAL APPLICABILITY

The circuit for a switching device, the switching system, and the processing method for a switching device of the present disclosure can suppress the power loss of the switching device. Therefore, according to the circuit for a switching device, the switching system, and the processing method for a switching device of the present disclosure, a switching device with lower power consumption can be realized, and power consumption of the equipment using the switching device can be reduced. As described above, the circuit for a switching device, the switching system, and the processing method for a switching device of the present disclosure are industrially useful.

REFERENCE MARKS IN THE DRAWINGS

10: switching device
20: circuit for switching device

21: first drive circuit
211: first gate power supply
22: second drive circuit
221: second gate power supply
25, 251, 252: gate power supply
26: processing part
261: determination circuit
2611: first determination circuit
2612: second determination circuit
2613: third determination circuit
262: control circuit
30: switching system
CC1: first clamp circuit
CC2: second clamp circuit
CC3: clamp circuit
CQ1: first capacitor
CQ2: second capacitor
I0, I1, I2: current
Loa: load
L1: first inductor
L2: second inductor
L0, L10: common inductor
Q1: first field effect transistor
Q2: second field effect transistor
Q3: third field effect transistor
Q4: fourth field effect transistor
1D, 2D, 3D, 4D: drain
1G, 2G, 3G, 4G: gate
1S, 2S, 3S, 4S: source
Ig: gate current
RgQ1: first gate resistor
RgQ2: second gate resistor
RV1: first resistance voltage dividing circuit
RV2: second resistance voltage dividing circuit
Vdc, Vac: power supply
VL1, VL2, VL3, VL4, VL10: voltage
Vg, Vgon1, Vgon2: gate voltage
VgQ1: first gate voltage
VgQ2: second gate voltage
VgQ3: third gate voltage
VgQ4: fourth gate voltage
VsQ1, VsQ2: potential

The invention claimed is:
1. A circuit for a switching device wherein
the circuit is used in a switching device including:
   a first path that includes a first field effect transistor and a first inductor, the first field effect transistor including a gate and a source, the first inductor being connected to the source of the first field effect transistor; and
   a second path that includes a second field effect transistor and a second inductor, the second field effect transistor including a gate and a source, the second inductor being connected to the source of the second field effect transistor,
the first path and the second path are connected in parallel to a power supply,
a first maximum current that is a maximum current during conduction of the first field effect transistor is smaller than a second maximum current that is a maximum current during conduction of the second field effect transistor, and
the circuit comprises a processing part that executes a specific operation according to a voltage difference between a voltage across the first inductor and a voltage across the second inductor.

2. The circuit for a switching device according to claim 1, wherein the processing part operates with a trigger that a first current flowing through the first path and a second current flowing through the second path become larger than or equal to the first maximum current from a current value less than the first maximum current.

3. The circuit for a switching device according to claim 1, wherein the specific operation includes an operation of determining that an overcurrent is flowing through the switching device when there is a predetermined change in the voltage difference.

4. The circuit for a switching device according to claim 1, wherein a gate voltage of the first field effect transistor during the conduction is smaller than a gate voltage of the second field effect transistor during the conduction.

5. The circuit for a switching device according to claim 1, wherein the first inductor has an inductance smaller than an inductance of the second inductor.

6. The circuit for a switching device according to claim 1, wherein the first field effect transistor includes an on-resistance different from an on-resistance of the second field effect transistor.

7. The circuit for a switching device according to claim 1, further comprising:
   a first drive circuit that includes a first gate power supply connected to the gate of the first field effect transistor and drives the first field effect transistor; and
   a second drive circuit that includes a second gate power supply connected to the gate of the second field effect transistor and drives the second field effect transistor, wherein
   the first gate power supply includes a negative electrode connected to the source of the first field effect transistor, and
   the second gate power supply includes a negative electrode connected to the source of the second field effect transistor.

8. The circuit for a switching device according to claim 1, wherein
   each of the first field effect transistor and the second field effect transistor is a junction field effect transistor,
   the circuit further comprises:
      a gate power supply;
      a first gate resistor connected between the gate power supply and the gate of the first field effect transistor; and
      a second gate resistor connected between the gate power supply and the gate of the second field effect transistor, and
   the first gate resistor has a resistance value larger than a resistance value of the second gate resistor.

9. The circuit for a switching device according to claim 1, wherein the specific operation includes an operation of limiting a current flowing through the second field effect transistor.

10. The circuit for a switching device according to claim 9, further comprising:
   a first drive circuit that includes a first gate power supply connected to the gate of the first field effect transistor and drives the first field effect transistor; and
   a second drive circuit that includes a second gate power supply connected to the gate of the second field effect transistor and drives the second field effect transistor,
   wherein a negative electrode of the first gate power supply and a negative electrode of the second gate power supply are connected to the source of the first field effect transistor.

11. The circuit for a switching device according to claim 9, wherein
each of the first field effect transistor and the second field effect transistor is a junction field effect transistor,
the circuit further comprises:
a gate power supply;
a first gate resistor connected between the gate power supply and the gate of the first field effect transistor; and
a second gate resistor connected between the gate power supply and the gate of the second field effect transistor,
the first gate resistor has a resistance value larger than a resistance value of the second gate resistor, and
the gate power supply includes a negative electrode connected to the source of the first field effect transistor.

12. The circuit for a switching device according to claim 1, further comprising a common inductor in which the first inductor and the second inductor are connected in common,
wherein the specific operation is an operation of performing overcurrent detection by comparing a voltage difference between a voltage across the common inductor and a voltage across the first inductor with a threshold.

13. The circuit for a switching device according to claim 1, wherein
the first path further includes a third field effect transistor including a gate and a source and connected in anti-series to the first field effect transistor, and a third inductor connected to the source of the third field effect transistor,
the second path further includes a fourth field effect transistor including a gate and a source and connected in anti-series to the second field effect transistor, and a fourth inductor connected to the source of the fourth field effect transistor, and
the processing part further includes
a first determination circuit that determines presence or absence of an overcurrent of the switching device according to a voltage difference between a voltage across the first inductor and a voltage across the second inductor, and
a second determination circuit that determines presence or absence of an overcurrent of the switching device according to a voltage difference between a voltage across the third inductor and a voltage across the fourth inductor.

14. The circuit for a switching device according to claim 13, wherein the processing part further includes
a third determination circuit that determines a direction in which an overcurrent is flowing based on a determination result of the first determination circuit and a determination result of the second determination circuit, and
a control circuit that controls the first field effect transistor and the second field effect transistor based on a determination result of the third determination circuit.

15. The circuit for a switching device according to claim 1, further comprising:
a first clamp circuit that is connected in parallel to the first inductor and clamps a voltage across the first inductor; and
a second clamp circuit is connected in parallel to the second inductor and clamps a voltage across the second inductor.

16. The circuit for a switching device according to claim 1, further comprising a clamp circuit that clamps a voltage difference between a voltage across the first inductor and a voltage across the second inductor.

17. The circuit for a switching device according to claim 1, further comprising:
a gate power supply;
a first resistance voltage dividing circuit connected between a positive electrode of the gate power supply and the source of the first field effect transistor; and
a second resistance voltage dividing circuit connected between the positive electrode of the gate power supply and the source of the second field effect transistor,
wherein
the first resistance voltage dividing circuit includes an output end connected to the gate of the first field effect transistor, and
the second resistance voltage dividing circuit includes an output end connected to the gate of the second field effect transistor.

18. The circuit for a switching device according to claim 1,
wherein each of the first field effect transistor and the second field effect transistor is a MOSFET or a normally-on JFET, and
the circuit further comprises:
a gate power supply;
a first capacitor connected between a positive electrode of the gate power supply and the gate of the first field effect transistor; and
a second capacitor connected between the positive electrode of the gate power supply and the gate of the second field effect transistor.

19. A switching system comprising:
the circuit for a switching device according to claim 1; and
the switching device.

20. A processing method wherein
the processing method is used in a switching device including
a first path that includes a first field effect transistor including a gate and a source, and a first inductor connected to the source of the first field effect transistor; and
a second path that includes a second field effect transistor including a gate and a source, and a second inductor connected to the source of the second field effect transistor,
the first path and the second path are connected in parallel to a power supply,
a first maximum current that is a maximum current during conduction of the first field effect transistor is smaller than a second maximum current that is a maximum current during conduction of the second field effect transistor, and
the processing method comprises executing a specific operation according to a voltage difference between a voltage across the first inductor and a voltage across the second inductor.

* * * * *